(12) United States Patent
Reghunathan et al.

(10) Patent No.: US 11,152,504 B2
(45) Date of Patent: Oct. 19, 2021

(54) METHODS OF FABRICATING FIELD-EFFECT TRANSISTORS

(71) Applicant: X-FAB Semiconductor Foundries AG, Erfurt (DE)

(72) Inventors: Manoj Chandrika Reghunathan, Kuching (MY); Peter Hofmann, Radeberg (DE)

(73) Assignee: X-FAB SEMICONDUCTOR FOUNDRIES GMBH, Erfurt (DE)

( * ) Notice: Subject to any disclaimer, the term of this patent is extended or adjusted under 35 U.S.C. 154(b) by 0 days.

(21) Appl. No.: 15/997,866

(22) Filed: Jun. 5, 2018

(65) Prior Publication Data

US 2018/0350979 A1 Dec. 6, 2018

(30) Foreign Application Priority Data

Jun. 5, 2017 (GB) .................................... 1708908

(51) Int. Cl.
| | | |
|---|---|---|
| *H01L 29/78* | (2006.01) |
| *H01L 29/66* | (2006.01) |
| *H01L 21/8238* | (2006.01) |
| *H01L 29/08* | (2006.01) |
| *H01L 21/225* | (2006.01) |
| *H01L 29/06* | (2006.01) |

(52) U.S. Cl.
CPC ...... *H01L 29/7816* (2013.01); *H01L 21/2253* (2013.01); *H01L 21/823814* (2013.01); *H01L 29/086* (2013.01); *H01L 29/0865* (2013.01); *H01L 29/0882* (2013.01); *H01L 29/66681* (2013.01); *H01L 29/66689* (2013.01); *H01L 29/0653* (2013.01)

(58) Field of Classification Search
None
See application file for complete search history.

(56) References Cited

U.S. PATENT DOCUMENTS

2015/0084126 A1* 3/2015 Jung ................. H01L 21/26586
257/339

OTHER PUBLICATIONS

GB, Combined Search and Examination Report Under Sections 17 & 18(3); GB Application No. 1708908.7; 6 pages (Nov. 30, 2017).

* cited by examiner

*Primary Examiner* — Jack S Chen
(74) *Attorney, Agent, or Firm* — Thompson Hine LLP

(57) ABSTRACT

Methods of fabricating a field-effect transistor, where the methods include providing a substrate, forming a first well of a first doping polarity type in the substrate, and forming a gate on a portion of the first well, the gate comprising an oxide layer and an at least partially conductive layer on the oxide layer. A second well of a second doping polarity type is formed by implanting ions in the first well, the second well extending under a portion of the gate. A first one of a source and drain of the first doping polarity type in or on the second well is formed, thereby defining a channel of the transistor under the gate. A second one of the source and drain of the first doping polarity type in or on the first well is formed. The second well may be formed by means of a two-step implant.

24 Claims, 24 Drawing Sheets

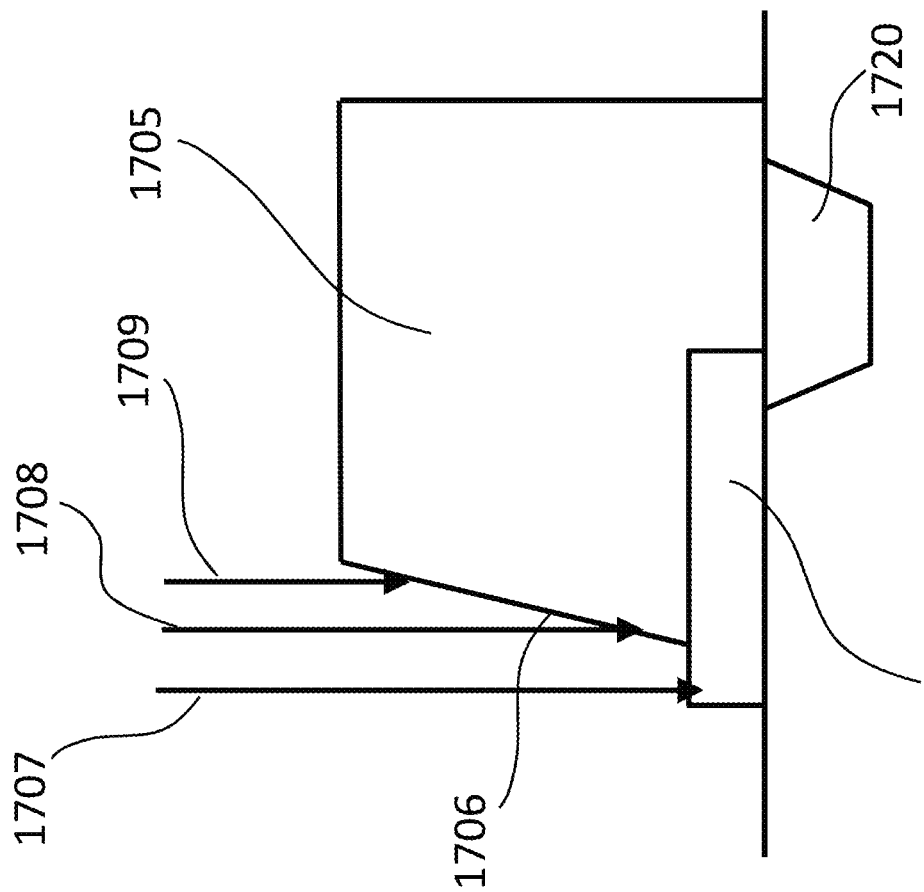
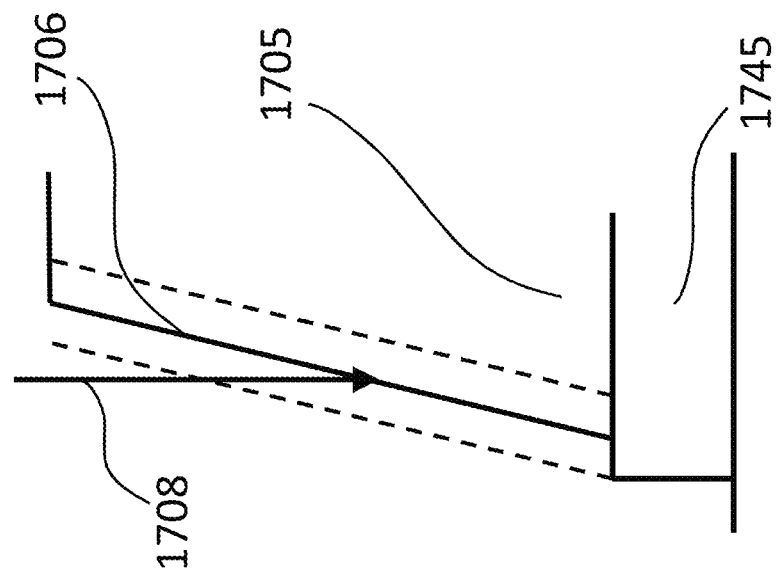
Fig. 17
Fig. 18

METHODS OF FABRICATING FIELD-EFFECT TRANSISTORS

BACKGROUND

The present invention relates to field-effect transistors and methods of fabricating field-effect transistors, and in particular to the fabrication of metal oxide semiconductor transistors with low on-state resistance.

A transistor can be thought of as an electrical switch, and is typically used to amplify, switch or control an electrical signal. Transistors have at least three terminals, with two arranged to allow current to flow between them, and a third arranged to control the current flow between the other two terminals. When no voltage or current is applied to the third terminal, the resistance of the transistor is sufficiently high so as to substantially prevent current flow between the other two terminals. When a voltage is applied to the third terminal, the resistance of the transistor is lowered, allowing current to flow through the transistor.

In a field-effect transistor (FET), the three terminals are called the source, drain and gate, and the current flow between the source and drain is controlled by applying voltage to the gate.

One form of FET is a metal oxide semiconductor field-effect transistor (MOSFET). An exemplary MOSFET 100 is shown in FIG. 1. The MOSFET 100 shown in FIG. 1 includes a gate electrode 105 as a control electrode. The gate electrode 105 is insulated from the remainder of the transistor by an oxide layer 110. The MOSFET 100 includes a source 115 and a drain 120, typically of n-type doping polarity. The source 115 and drain 120 are disposed in or on a substrate 125 of typically p-type doping polarity. A channel is formed in a portion of the substrate 125 between the source 115 and drain 120 underneath the oxide layer 110 and gate electrode 105. A control voltage can be applied to the gate electrode 105 to produce an electric field that permeates through oxide layer 110 and into the channel. The strength of the electric field can be varied by varying the control voltage applied to the gate electrode 105. The electric field is used to control current flow between the source 115 and the drain 120.

The operation of FETs has been described and will be further described with reference to FIG. 1. However, the skilled person will appreciate that the present disclosure also applies to a scenario in which the source and the drain of a FET are of p-type doping polarity and the body of the FET is of n-type doping polarity.

The FET is in an off-state when there is no voltage or insufficient voltage applied to its gate to enable substantial current to flow between its source and drain. The FET is in an on-state when a sufficient voltage over a certain threshold value is applied to its gate to enable substantial or even just an appreciable current to flow between its source and drain.

In an off-state of a FET, substantial electric current will not be able to flow between its source and drain, typically due to the presence of a p-n type junction between its channel and the drain. If the strength of the electric field in the channel is sufficiently high, a concentration of charge carriers (e.g. electrons) will form a thin inversion layer in the channel of the transistor adjacent to the metal oxide. This inversion layer may provide a conductive path between the source and the drain. The inversion layer may also eliminate the presence of the p-n junction between the channel and the drain. The gate voltage which causes the volume density of charge carriers (e.g. electrons) in the inversion layer to be the same as the volume density of oppositely charged charge carriers (e.g. holes) in the remainder of the body of the transistor is known as the threshold voltage.

FETs can generally be assessed by their breakdown voltage and on-state resistance. Breakdown of a FET can occur when the transistor is in an off-state, but a sufficiently large potential difference is present between the source and the drain for current to pass across the p-n junction between the channel and drain. That is, breakdown occurs when there is a sufficient potential difference present between the source and the drain of the transistor to enable substantial current to flow through the transistor without requiring a set voltage to be applied to its gate. On-state resistance refers to the electrical resistance between the source and the drain of a FET when in an on-state.

A laterally diffused metal oxide semiconductor (LDMOS) transistor is a version of a MOSFET. LDMOS transistors address the need for MOSFETs that have high breakdown voltage values and low on-state resistance. LDMOS transistors are typically used in high voltage complementary metal oxide circuits.

LDMOS transistors typically have a region of p-type doping polarity (p-type region) disposed in a region of low n-type doping polarity (n-type region) disposed in or on a substrate. A source is typically disposed in the p-type region. A drain is typically disposed in the n-type region. LDMOS transistors further comprise a drift region which may be a portion of the n-type region. A portion of the p-type region adjacent to the source and the drift region typically forms a channel of the transistor underneath a gate and oxide layer of the transistor. The channel typically interfaces with the source and the drift region. Typically, the drift region of an LDMOS transistor is present between the channel and the drain of the transistor. By having a low-doped n-type drift region adjacent to the p-type channel, a higher breakdown voltage of the transistor can be achieved compared with conventional MOSFETs.

SUMMARY

There is an ever-present demand to decrease the size of LDMOS transistors. There is also a demand to produce LDMOS transistors with even higher breakdown voltages and even lower on-state resistance. Higher breakdown voltages and low on-state resistance can be achieved through the production of LDMOS transistors with short channel lengths. However, the production of LDMOS transistors with increasingly smaller channel lengths and overall size presents a series of problems.

Using conventional techniques, it is not practical to shrink the channel length of LDMOS transistors. Producing LDMOS transistors with short channel lengths (typically below 0.5 micrometres) may give rise to misalignment errors in manufacture. In turn, LDMOS transistors with short channel lengths may be susceptible to hot carrier injection (HCI) and current leakage problems when in operation.

In light of the above, the inventors have appreciated that there is a need for LDMOS transistors that address the above mentioned problems. They have also appreciated that there is a need for a method of fabricating LDMOS transistors that address the above mentioned problems whilst still providing LDMOS transistors with suitably short channel lengths.

In a first aspect, provided herein is a method of fabricating a field-effect transistor. The method comprises: providing a substrate; forming a first well of a first doping polarity type in the substrate; and forming a gate on a portion of the first well, the gate comprising an oxide layer and an at least partially conductive layer on the oxide layer. The method further comprises: forming a second well of a second doping polarity type at least partially in the first well by implanting ions in the first well, the second well extending under a portion of the gate, the second doping polarity type being of opposite type to the first doping polarity type; forming a first one of a source and drain of the first doping polarity type in or on the second well, thereby defining a channel of the transistor under the gate; and forming a second one of the source and drain of the first doping polarity type in or on the first well. Said implanting comprises: directing at least a first beam of ions towards the first well at an angle substantially perpendicular to a surface plane of the substrate; and directing at least a second beam of ions towards the first well at an angle substantially offset from a surface normal of the substrate.

The channel may be formed in a portion of the second well and may have a first edge and a second edge, wherein the first edge is located at an interface between the second well and the first one of the source and drain, and the second edge is located under the gate at an interface between the second well and the first well.

The first one of the source and drain may be formed directly in or on the second well. The second one of the source and drain may be formed directly in or on the first well. The second well may be formed completely in the first well.

Forming the second well may comprise using the gate as a mask or as part of a mask during an implant for forming the second well.

The method may further comprise carrying out a spike anneal.

By using the gate as a mask or as part of a mask during the implant for forming the second well, the second edge of the channel may be formed in a self-aligned manner with respect to the gate.

In forming the first one of the source and drain, the first edge of the channel may be defined in a self-aligned manner with respect to the gate. Both edges of the channel may be formed in a self-aligned manner.

In forming the second one of the source and drain of the first doping polarity type in or on the first well, a drift region of the transistor in the first well may be defined, the drift region extending from the channel of the transistor to the second one of the source and drain.

Forming the second well may be carried out in an area adjacent to one side of the gate.

The method may further comprise forming a mask on at least a portion of the gate and at least a portion of the first well.

An edge of the gate and an edge of the mask may be substantially aligned.

The implanting may comprise directing said first beam of ions towards the first well before directing said second beam of ions towards the first well.

The method may further comprise, after directing said first beam and before directing said second beam, reducing a thickness of the mask on said portion of the gate.

The directing the beam of ions towards the first well at an angle substantially offset from a surface normal of the substrate may cause the second edge of the second well to be formed under the gate in a self-aligned manner with respect to the gate.

The method may further comprise adding at least one side wall spacer to the gate, which may be done after forming the second well and before forming the first one of the source and drain.

In a second aspect, also provided herein is a method for use in fabricating a field-effect transistor. The method comprises: providing a substrate; forming a first well of a first doping polarity type in the substrate; and forming a gate on a portion of the first well, the gate comprising an oxide layer and an at least partially conductive layer on the oxide layer. The method further comprises: forming a second well of a second doping polarity type in a portion of the first well by implanting ions in the first well in an area adjacent to and extending under a portion of the gate; and forming a first one of a source and drain of the first doping polarity type in or on the second well, thereby defining a self-aligned channel of the transistor in the second well. Said implanting comprises: directing at least a first beam of ions towards the first well at an angle substantially perpendicular to a surface plane of the substrate; and directing at least a second beam of ions towards the first well at an angle substantially offset from a surface normal of the substrate.

The method may further comprise forming a second one of the source and drain of the first doping polarity type directly in or on the first well, thereby defining a drift region of the transistor in the first well.

In a third aspect, provided herein is a method of fabricating a field-effect transistor comprising: providing a substrate; forming a first well of a first doping polarity type in the substrate; and forming a gate on a portion of the first well, the gate comprising an oxide layer and an at least partially conductive layer on the oxide layer. The method further comprises forming a second well of a second doping polarity type in a portion of the first well by implanting ions in the first well in an area adjacent to and extending under a portion of the gate, thereby defining a self-aligned channel of the transistor under the gate. Said implanting comprises: directing at least a first beam of ions towards the first well at an angle substantially perpendicular to a surface plane of the substrate; and directing at least a second beam of ions towards the first well at an angle substantially offset from a surface normal of the substrate.

In any of the above aspects, the method may further comprise implanting a layer of the first doping polarity type in the second well prior to forming the first one of a source and drain of the first doping polarity type in or on the second well.

The layer of the first doping polarity type in the second well may be shallower than the second well and the first one of the source and drain of the first doping polarity type in or on the second well.

The layer in the second well may extend up to and/or underneath the gate.

At least a portion of the layer may function as an extension of the first one of a source and drain of the first doping polarity type in or on the second well.

In another aspect, provided herein is a method of fabricating a field-effect transistor comprising a channel having two channel edges, the method comprising: forming both channel edges in a self-aligned manner with respect to a gate of the transistor, wherein both channel edges are formed by implanting ions. Forming one of the channel edges comprises directing, at an angle substantially parallel to a surface normal of the transistor being formed, at least a first beam of ions towards said transistor; and directing at least a second beam of ions towards said transistor at an angle substantially offset from said surface normal of said transistor.

Both channel edges may be formed by implanting ions on or from the same side of the gate of the transistor.

In another aspect, provided herein is a field-effect transistor that includes a substrate, a first well of a first doping polarity type in the substrate, a gate on a portion of the first well, the gate comprising an oxide layer and an at least partially conductive layer on the oxide layer, and a second well of a second doping polarity type at least partially in the first well, the second well extending under a portion of the gate, the second doping polarity type being of opposite type to the first doping polarity type. The field-effect transistor further includes a first one of a source and drain of the first doping polarity type in or on the second well, the second well and said first one of the source and drain defining a channel of the transistor under the gate, and a second one of the source and drain of the first doping polarity type in or on the first well, wherein the second well comprises a first implant and a second implant, wherein the first implant extends to a greater depth than the second implant, and wherein a lateral extent of the second implant is greater than a lateral extent of the first implant.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

Some embodiments of the invention will now be described by way of example only and with reference to the accompanying drawings, in which:

FIG. 17 illustrates a schematic cross-section of a portion of a partially completed transistor which is being subjected to an implant;

FIG. 18 illustrates a schematic cross-section of a portion of a partially completed transistor which is being subjected to an implant;

DETAILED DESCRIPTION

Figure 1:
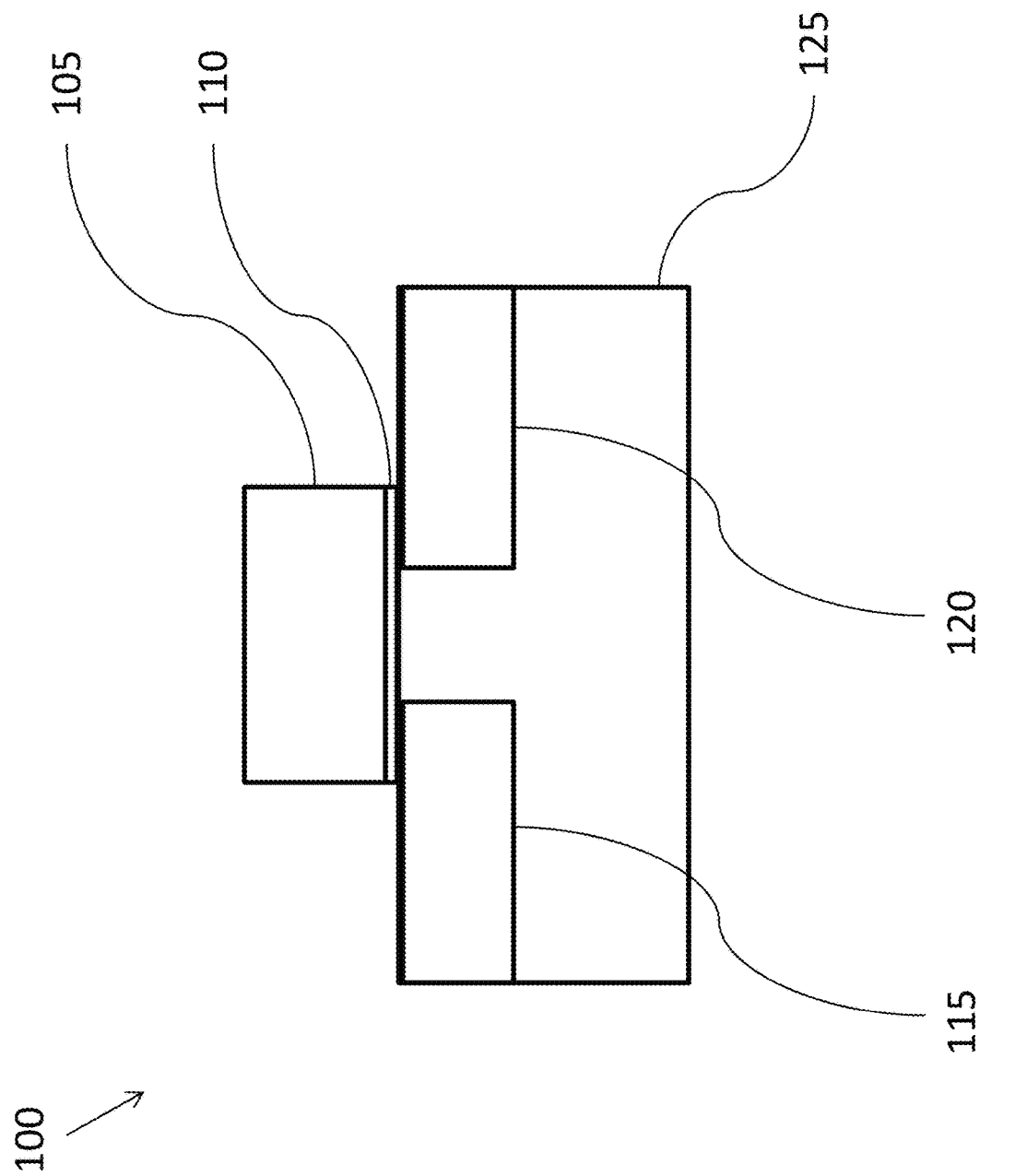
FIG. 1 is a schematic cross-section through an exemplary MOSFET structure.

Generally disclosed herein are methods for fabricating LDMOS transistors. The methods disclosed herein enable LDMOS transistors to be produced that have low on-state resistance and that can operate in high voltage integrated circuits. That is, the transistors can operate in scenarios where there are large potential differences between the associated source and the drain without transistor breakdown occurring. Such scenarios may arise in high voltage complementary metal oxide circuits.

The methods of fabrication disclosed herein may enable simpler production of LDMOS transistors compared with conventional methods of LDMOS transistor fabrication. The methods disclosed herein may also be more efficient and cost effective when compared with conventional methods. The methods may result in LDMOS transistors being produced that have short channel lengths and more precise alignment than some prior art techniques.

The skilled person will appreciate that although the methods disclosed herein are described with reference to LDMOS transistors, they may find application in other forms of FETs. LDMOS transistors have been referred to in order to describe and illustrate example embodiments of the invention. Reference to LDMOS transistors should not be construed as a limitation of the methods of the present disclosure. Hereinafter LDMOS transistors will be referred to as transistors for simplicity.

The inventors have appreciated that the above described advantages can be achieved by producing self-aligned channels in transistors. In the context of the methods and transistors described herein, a self-aligned channel is a channel of a FET where both a far-side edge and a near-side edge of the channel are self-aligned. For the purposes of this disclosure, the far-side edge of a channel of a transistor is to be construed as the edge of the channel that is present underneath the gate of the transistor and that interfaces with a drift region of the transistor. The near-side edge of the channel is to be construed as the edge of the channel that interfaces with a source of the transistor. The far-side and near-side edges of a transistor are self-aligned with respect to the position of the gate of the transistor and, in particular, the position of the near-side edge of the gate. The near-side edge of the gate is the edge of the gate closest to the near-side edge of the channel.

Certain embodiments make it possible to produce self-aligned channels that have a shortened channel length. Self-aligned channels, by definition, are less susceptible to misalignment with a corresponding gate than conventional transistor channels.

The inventors have appreciated that a self-aligned channel of a transistor can be formed following the formation of a gate of the transistor. In particular, a self-aligned channel can be formed by initially forming a first well in a substrate and then forming a gate portion on the first well. A second well can be formed at least partially in the first well such that the second well extends under a portion of the gate. A source can be formed in the second well to complete the definition of the channel between the source and a drift region of the transistor underneath the gate, wherein the channel is a portion of the second well.

By forming the second well after the gate has been formed, the far-side edge of the second well underneath the gate can be self-aligned. That is, the position of the far-side edge of the second well with respect to the position of the gate can be aligned to a greater degree of precision than if the gate was formed subsequently over the far-side edge of the second well. Self-alignment of the far-side edge of the second well can, in part, be achieved by using the gate as a mask or as part of a mask in the formation process of the second well. By forming a source in the second well, a near-side edge of the channel can be defined where the side of the source interfaces with the second well. This near-side edge of the channel is also formed in a self-aligned manner, as its position relative to the gate is dependent only on the placement of the source itself.

An exemplary transistor structure will now be described.

Figure 2:
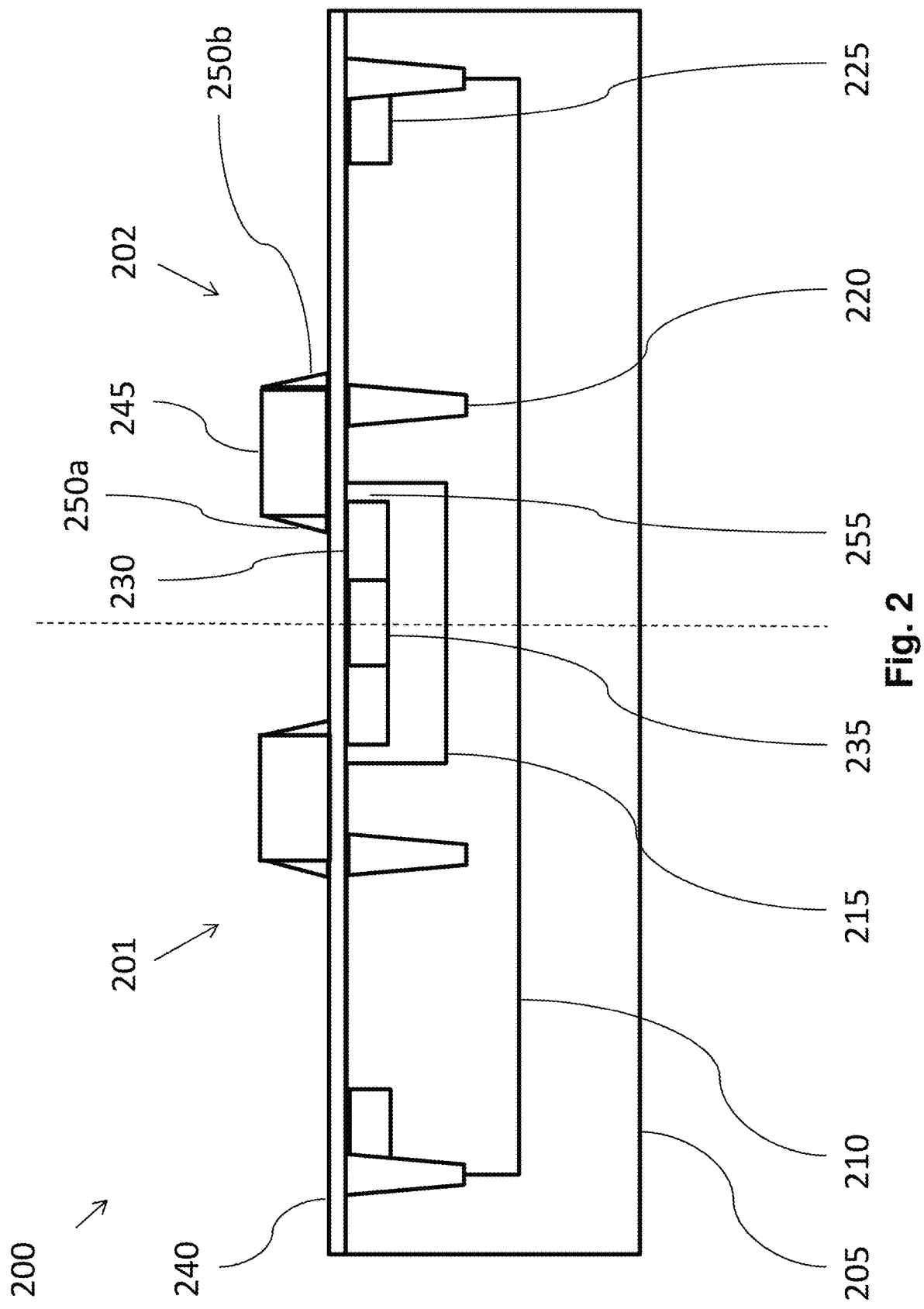
FIG. 2 is a schematic cross-section through an exemplary LDMOS transistor structure.

FIG. 2 is a schematic cross-section of an exemplary LDMOS transistor structure 200. The transistor structure 200 comprises two LDMOS transistors 201, 202. One of the transistors 201 is present on the left-hand side of the dashed line in FIG. 2, with the other transistor 202 being present on the right-hand side. The skilled person will appreciate that FIG. 2 is a schematic diagram showing a schematic view of a transistor structure. In-practice, the shape and appearance of the components of the transistor structure 200 shown will be different. The skilled person will appreciate that the relative shapes and sizes of the cross-sections of the components shown are likely to be different in physical examples of the exemplary transistor structure 200. Further, the skilled person will appreciate that FIG. 2 shows a cross-section of the transistor structure 200 and, therefore, is not a complete representation of the structure 200. Cross-sections of the transistor structure 200 may vary with depth. Exemplary LDMOS transistor structures may have a shape generally resembling a ring.

FIG. 2 is intended to aid the understanding of the methods disclosed herein by indicating the relative position and configuration of the components of the transistor structure 200. For ease of description, the transistor structure 200 will be described, where applicable, with reference to the transistor 202 on the right-hand side of the transistor structure 200. The transistor 201 on the left-hand side of the transistor structure 200 comprises corresponding components and is (for the purposes of this cross-sectional view) a mirror image of the transistor 202 on the right-hand side of the transistor structure 200. Therefore, the structure and configuration of the transistor 201 on the left-hand side of the transistor structure 200 can easily be deduced from FIG. 2 with reference to the below description. Hereafter, reference to "transistor" will be a reference to the transistor 202 on the right-hand side of the transistor structure 200, unless specified otherwise.

The transistor structure 200 comprises a substrate 205. The substrate 205 may comprise a silicon substrate. The substrate 205 of the transistor structure 200 is of p-type doping polarity. In exemplary transistor structures, the substrate 205 is lightly doped. A first well 210 is disposed in the substrate 205. The first well 210 can be referred to herein as a drift well 210. The drift well 210 of the transistor structure is of n-type doping polarity. In exemplary transistor structures, the drift well 210 is lightly doped.

A second well 215 is disposed in the drift well 210. In some exemplary transistor structures, the second well 215 may be disposed only partially in the drift well 210. That is, there may be a portion of the second well 215 that is not disposed in the drift well 210. This would more typically apply to transistor structures which are not of a ring shape. The second well 215 is of p-type doping polarity and is herein referred to as a p-well 215.

A shallow trench insulator 220 of the transistor 202 is also disposed in the drift well 210. The shallow trench insulator 220 is disposed to the side of the p-well 215, but is separated from the p-well 215 by a portion of the drift well 210. Other shallow trench insulators are also disposed in the transistor structure 200 at various positions. In particular, shallow trench insulators are disposed at either side of the drift well 210. The shallow trench insulators may be composed of any suitable insulating material, including silicon oxide.

A drain 225 of the transistor 202 is disposed in the drift well 210. In some exemplary transistor structures, the drain 225 may be positioned on the drift well 210 or partially in the drift well 210, rather than completely in it. The drain 225 is disposed in drift well 210 with a degree of separation between it and the shallow insulator trench 220. The drain 225 may be connected to an external conductive path or component via a silicide contact on or within the drain 225.

A source 230 of the transistor 202 is disposed in the p-well 215 of the transistor structure 200. The source 230 is disposed such that there is a lateral portion of the p-well 215 between the edge of the source 230 and an edge of the p-well 215 itself. In some exemplary transistor structures, the source 230 may be positioned on the p-well 215 or partially in the p-well, rather than completely in it. On the other side of the source 230, an implant 235 of opposite doping polarity to the source 230 is disposed adjacent to the source 230 in the p-well 215. The implant 235 provides separation of the source 230 from the source of the transistor 201 on the left-hand side of the transistor structure 200. The source 230 and drain 225 of the transistor 202 are of n-type doping polarity. The source 230 may be connected to an external conductive path or component via a silicide contact on or within the source 230.

A thin insulating layer 240 is present on top of a surface of the transistor structure 202, the top surface being formed from a combination of the substrate 205, the drift well 210, the p-well 215 and additional components disposed therein. The insulating layer 240 may have defined openings to allow electrical connections to be made with sources, drains and other components of the transistor structure 200. A gate 245 of the transistor 202 is formed on top of the insulating layer 240. The gate 245 is also positioned above a portion of the p-well 215. That is, a portion of the p-well 215 extends under the gate 245. The gate 245 is also positioned over the shallow trench insulator 220 in this exemplary transistor 202. The gate comprises insulating side portions 250a, 250b. The insulating layer 240 of the transistor structure 200 may be composed of any insulating material, including silicon oxide. The gate 245 may be composed of any conductive or semiconductor material. In this exemplary transistor 202, the gate is composed of polysilicon. The insulating side portions 250a, 250b of the gate 245 may be composed of any insulating material, including silicon oxide.

In some exemplary transistor structures, shallow insulator trenches may not be present. Alternatively, additional shallow insulator trenches or other insulator trenches may be present in some embodiments. In some exemplary transistor structures, the drain of the transistor may be closer to its associated p-well and gate than is shown in FIG. 2. Similarly, the drain of the transistor may be further away from the p-well and gate of that transistor. In some exemplary transistor structures, the insulating layer may only be disposed underneath the gate. That is, the insulating layer may not cover the entire surface defined by the substrate, drift well, p-well and any additional components of the transistor structure. In some exemplary transistor structures, the transistor gate may be larger or smaller relative to the other components in that structure. Further, the transistor gate may be configured and positioned such that it covers a larger area of a surface of its associated transistor structure.

The above mentioned components including the drift well 210, p-well 215, source 230, drain 225 and implant 235 may be formed of any semiconductor material (including silicon, germanium etc.), together with appropriate doping elements (including boron, phosphorus etc.). The skilled person will know of numerous materials that can be used to form appropriate components, wells and portions of n-type and p-type doping polarity with the required doping concentrations in a substrate.

A channel 255 of the transistor 202 is formed in the lateral portion of the p-well 215 situated between the edge of the source 230 and an edge of the p-well 215 itself. The channel 255 comprises a near-side edge, the near-side edge being a (lateral) border defined between the source 230 of the transistor 202 and the p-well 215. The near-side edge is self-aligned with respect to the gate 245, as will be described below. The channel also comprises a far-side edge, the far-side edge being a lateral border under the gate 245 between the lateral portion of the p-well 215 and an adjacent lateral portion of the drift well 210. The far-side edge is also self-aligned with respect to the gate 245, as will be described below.

The far-side edge of the channel 255 interfacing with the drift well 210 forms a p-n junction. The p-n junction generally inhibits significant electrical current from flowing from the source 230 to the drain 225 below the breakdown voltage of the transistor 202. The channel 255 of the transistor 202 is positioned under the gate 245 so, when a sufficient voltage is applied to the gate 245, an inversion layer will form in the channel 255 of p-type doping polarity. The generated inversion layer will enable current to flow across (or through) the channel 255 and the interface between the channel 255 and the drift well 210.

The (entire) channel 255 is self-aligned with respect to the gate 245 of the transistor. In exemplary transistors, such as the transistor 202 shown in FIG. 2, the length of the channel 255 from the near-side edge to the far-side edge can be less than 0.5 micrometres. However, in other transistors, the channel lengths may be different. In some exemplary embodiments, the channel length may be less than or substantially equal to 0.2 micrometres. In other exemplary embodiments, the channel length may be less than or substantially equal to 150 nanometres.

In the transistor 202, the region in which lies the path taken by charge carriers travelling from the source 230 to the drain 225 inside the drift well 210 can be referred to as the drift region. The length of the drift region can be selected during manufacture, e.g. to vary the potential difference between the source 230 and the drain 225 at which breakdown of the transistor 202 first occurs. In other words, the length of the drift region may correlate with the breakdown voltage of the transistor 202. In exemplary transistors, such as the transistor 202 shown in FIG. 2, the breakdown voltage is above 5 Volts. In other transistors, the breakdown voltages may be different. It is of note that an increase in length of the drift region in drift well 210 will cause an increase in the on-state resistance of the transistor 202.

The exemplary transistor 202 of the transistor structure 200 of FIG. 2 is advantageous when compared with other transistors because its channel 255 is self-aligned. In certain embodiments, the length of the channel 255 can be selected and the channel 255 made with more accuracy and precision due to its self-alignment with the edge of the transistor's gate 245. This in turn means that the properties of the transistor 202 when in operation can be more readily and accurately predicted.

An exemplary method of fabricating the FET structure 200 of FIG. 2 will now be described with reference to FIGS. 3 to 12. Particular reference will be made to the formation of the transistor 202 on the right-hand side of the transistor structure 200. However, the skilled person will recognise, in this example, that the transistor 201 on the left-hand side of the structure 200 can be formed simultaneously.

Figure 3:
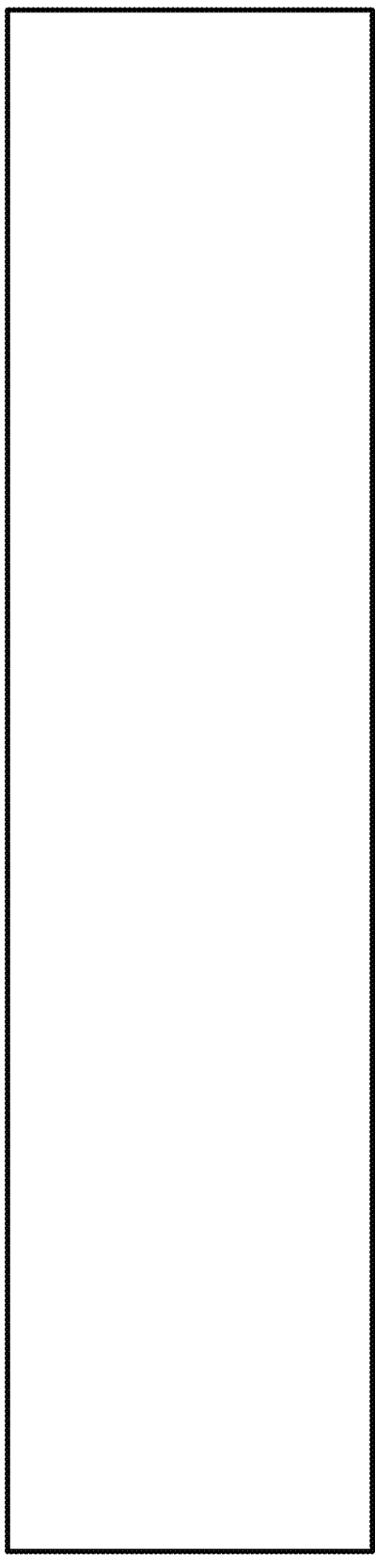
FIG. 3 is a schematic cross-section showing a substrate on which fabrication of the exemplary transistor structure of FIG. 2 takes place.

FIG. 3 is a schematic cross-section showing a starting point in the fabrication of the exemplary transistor structure 200. Initially, the substrate 205 is provided. Typically, the substrate 205 is composed of a lightly p-doped semiconductor material, e.g. silicon. The preparation of the substrate 205 may comprise forming a pad oxide (not shown) on the silicon substrate and depositing a silicon nitride layer (not shown). The skilled person will appreciate that only a portion of the substrate 205 may be shown in FIGS. 2 to 12. The transistor structure 200 may be one of many structures present within and on the substrate 205. Typically, the substrate 205 is part of a larger complementary metal oxide circuit or chip.

Figure 4:
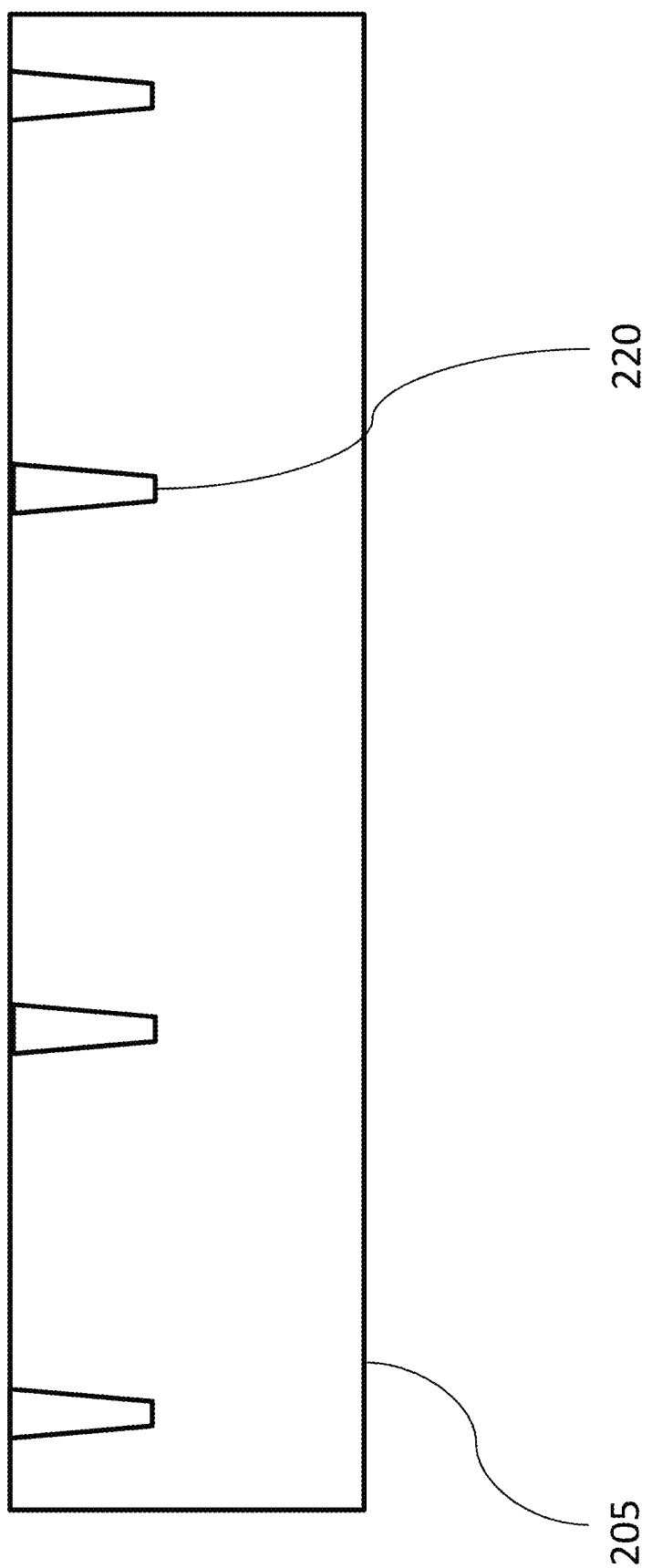
FIG. 4 is a schematic cross-section showing the substrate of FIG. 3 in which a series of shallow trench insulators have been added.

As shown in FIG. 4, following the preparation of the substrate 205, a series of shallow trench insulators are added into the substrate 205. The series of shallow trench insulators includes the shallow trench insulator 220 of the transistor 202 to be formed. The shallow trench insulators can be configured to isolate different electrical components or devices that are formed on the substrate 205. The shallow trench insulators may be configured to form part of a component or device (as in the case of the shallow insulator trench 220). The insulator trenches may be spaced apart in regular or irregular intervals. Generally, the insulator trenches are utilised to separate the substrate 205 into various regions that will form different components and/or devices.

The shallow insulator trenches are typically filled with silicon oxide. Once the shallow trench insulators have been formed, chemical mechanical polishing may be utilised to polish away any unwanted silicon oxide on the surface of the substrate 205. Such chemical mechanical polishing may assist in providing a planar substrate top surface for further fabrication steps. The pad oxide and silicon nitride layers on the substrate 205 may also be removed.

Figure 5:
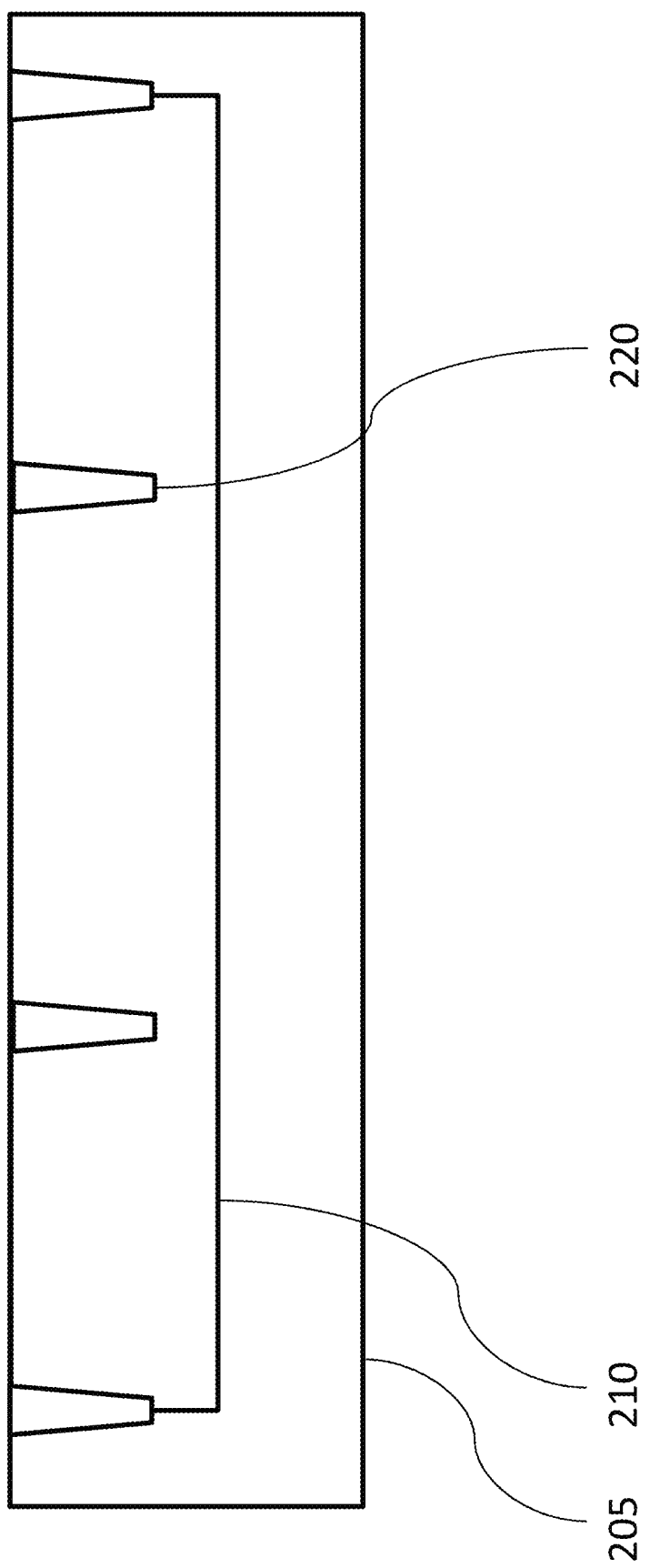
FIG. 5 is a schematic cross-section of the structure of FIG. 4 further comprising a first well formed in the substrate.

The drift well 210 is then formed in the substrate 205, as shown in FIG. 5. The drift well 210 may be isolated or partially isolated from neighbouring components and devices by the shallow trench insulators positioned to the sides of the drift well 210. Typically, the drift well 210 is composed of a material of lightly n-doped semiconductor material. Typically the drift well 210 is implanted into the substrate 205 using ion implantation techniques. The drift well 210 extends over the entire active region of the to-be formed transistors 201, 202. This aspect of the fabrication process may eliminate sources of misalignment error arising from placement of a drift well (and the drift region to be defined) relative to other components of the to-be-formed transistors, as also explained below. This is because this exemplary method described does not require the alignment of any edge of the drift well 210 with any other components of the to-be-formed transistors. The other components of the to-be-formed transistors are formed in or on the drift well and only require alignment relative to one another.

Figure 6:
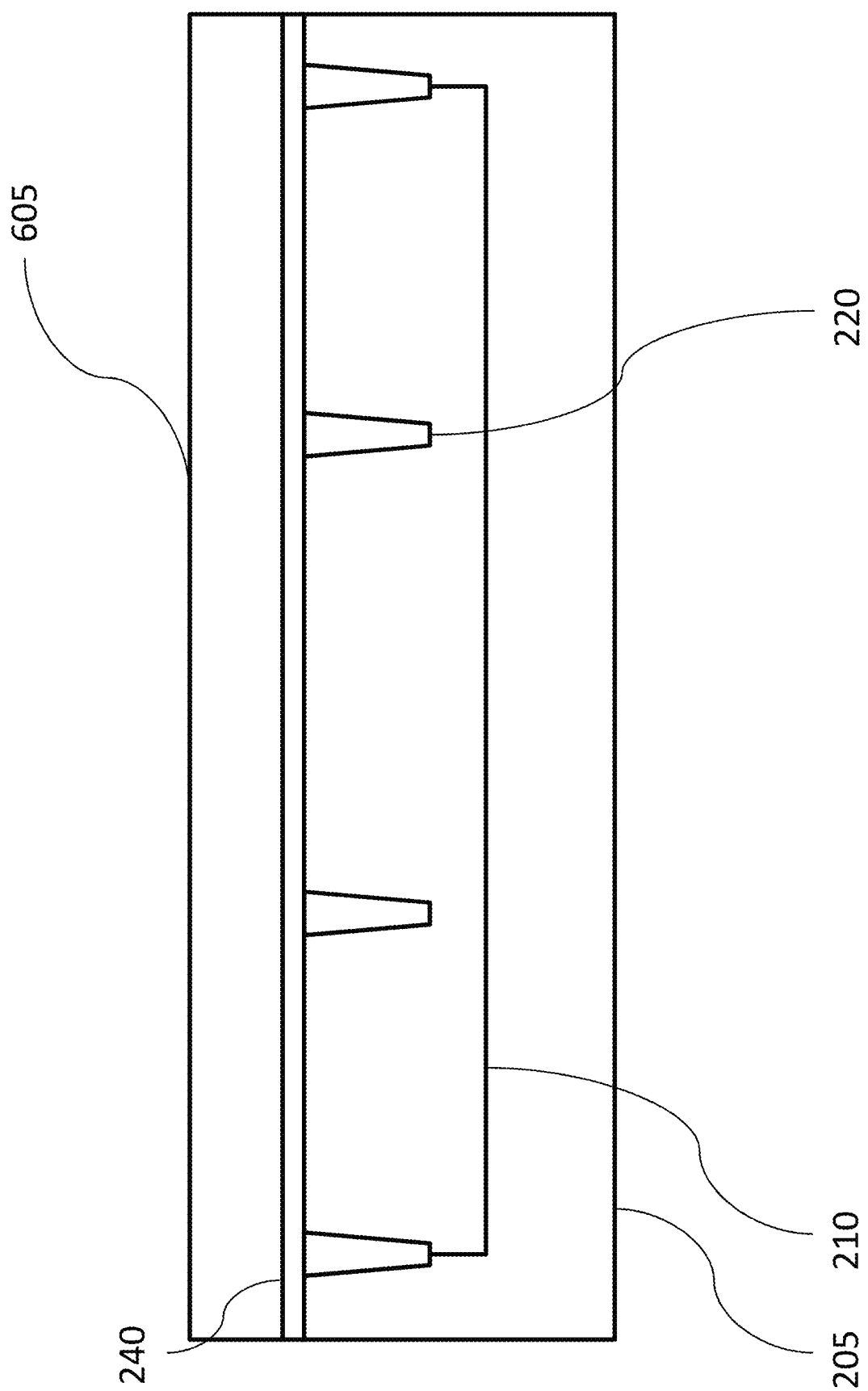
FIG. 6 is a schematic cross-section of the structure of FIG. 5 further comprising an insulating layer and a further layer.

Following various masking, implantation and cleaning steps that may be required for other components being fabricated on the substrate 205, the insulating layer 240 is formed on the substrate 205 and the drift well 210. The insulating layer 240 being present on the substrate 205 and the drift well 210 is shown in FIG. 6. As shown, the insulating layer 240 extends over the entirety of the portion of the substrate 205 shown and the drift well 210. The skilled person will appreciate that the insulating layer 240 may extend further over portions of the substrate 205 not shown in the figures.

Following application of the insulating layer 240 to the transistor structure 200, a layer 605 can be deposited on the insulating layer 240. The layer 605 is primarily for use in forming the gates of the transistor structure 200, including the gate 245 of the transistor 202. The layer 605 may be composed of polysilicon.

Figure 7:
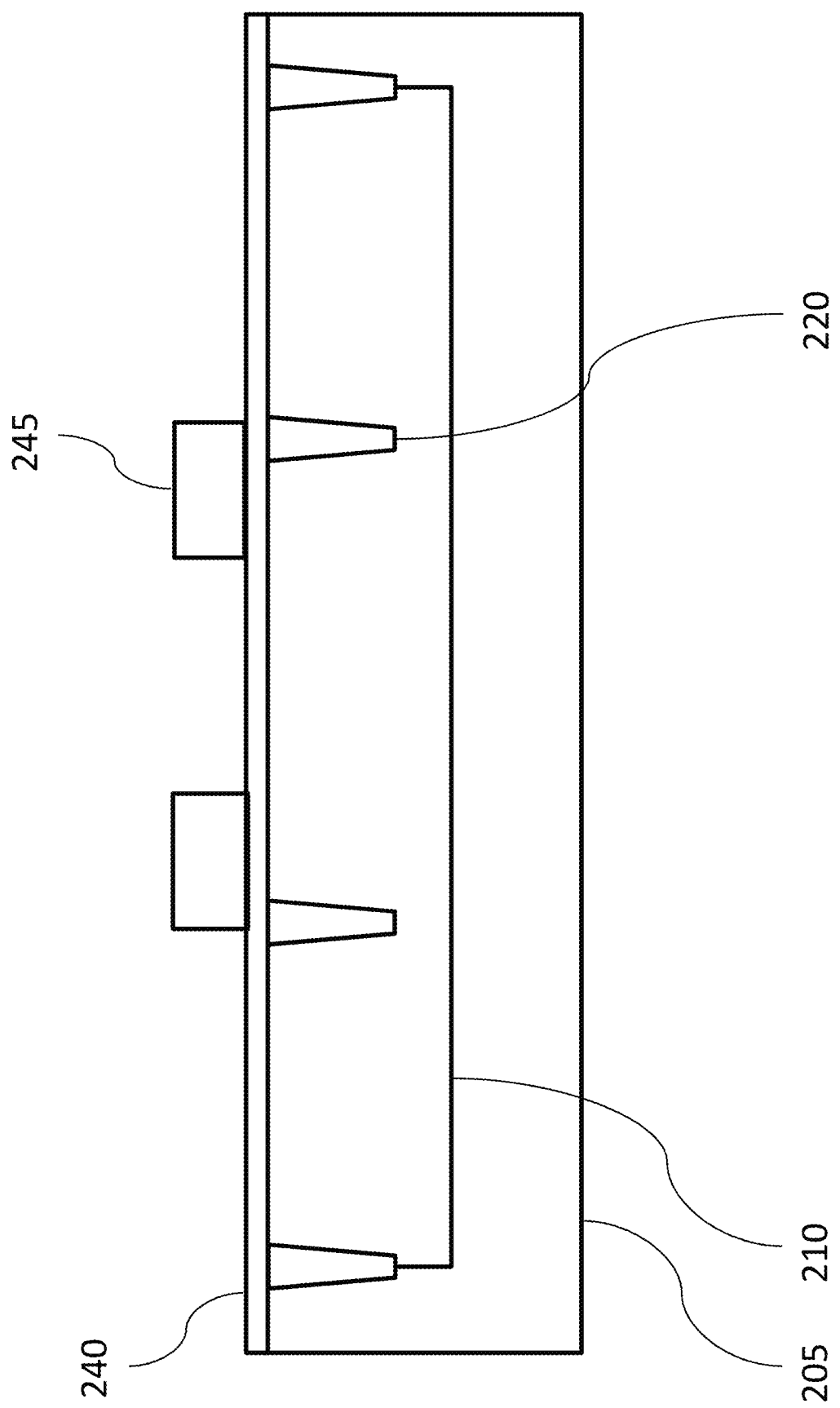
FIG. 7 is a schematic cross-section of the structure of FIG. 6 further comprising gates formed and positioned over the first well.

FIG. 7 shows the development of the transistor structure 200 with gates formed and positioned over the drift well 210. The gates, which may be formed by patterning and etching of the polysilicon layer 605, include the gate 245 of the to-be-formed transistor 202. The gates are positioned above a portion of the insulating layer 240.

Figure 8:
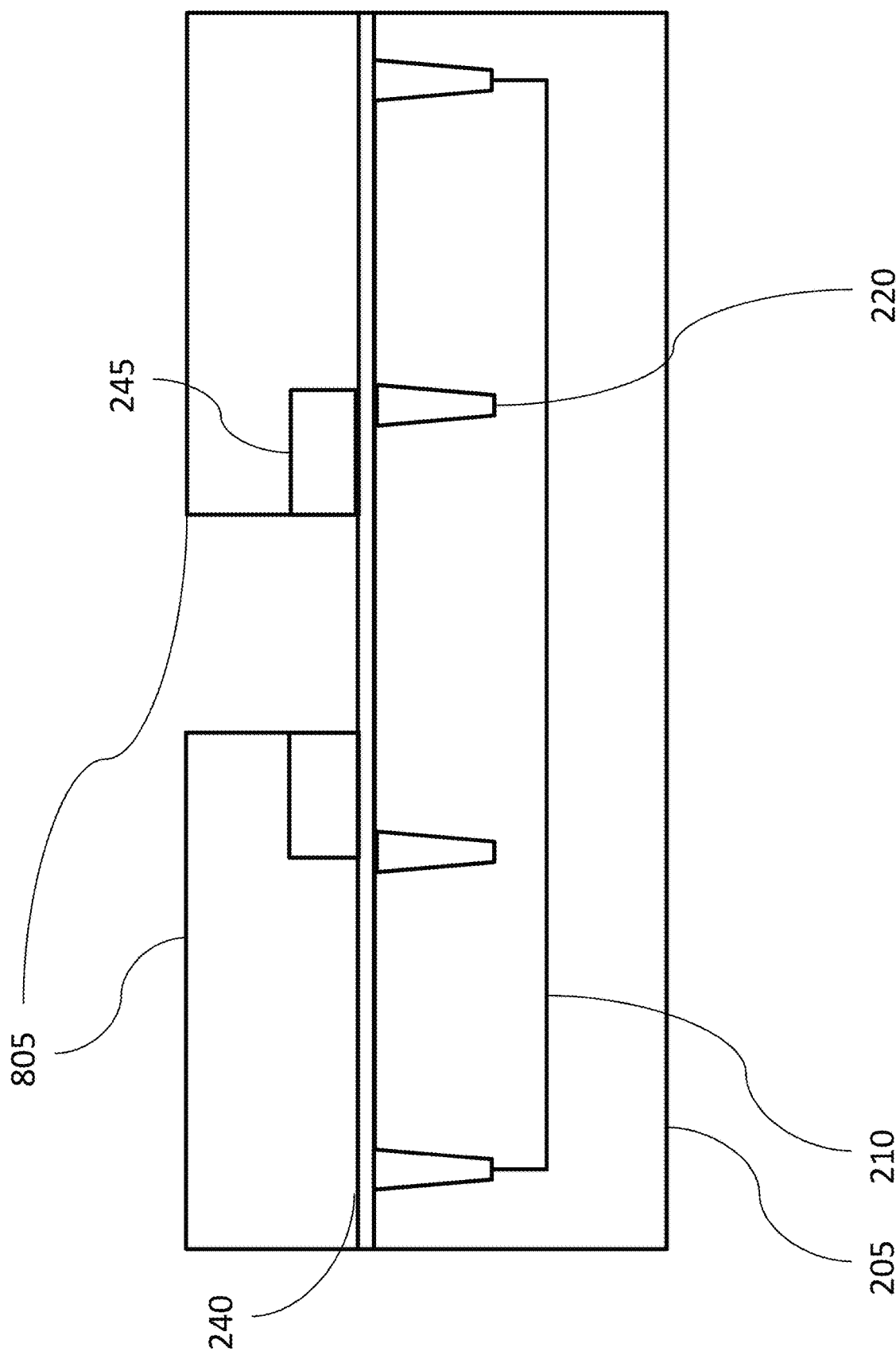
FIG. 8 is a schematic cross-section of the structure of FIG. 7 with a mask applied to it.

FIG. 8 shows the development of the transistor structure with a mask 805 applied to the transistor structure 200. Following the formation of the gates, the p-well mask 805 is applied to the top of the to-be-formed transistor structure 200. The mask 805 has two portions positioned either side of the area into which the p-well 215 will be implanted. Typically, the mask 805 is substantially aligned with the edges of the gates that are opposing one another. The mask 805, in combination with the gates, defines a recess into which ions can be implanted into the drift well 210 to at least partially form the p-well 215. The mask 805 is utilised during implantation of the p-well 215 to reduce the extent to which other areas of the transistor structure 200, including the gates, are affected by the ion implantation or otherwise. Typically, the mask 805 is composed of photoresist, but other materials may be used.

Figure 9:
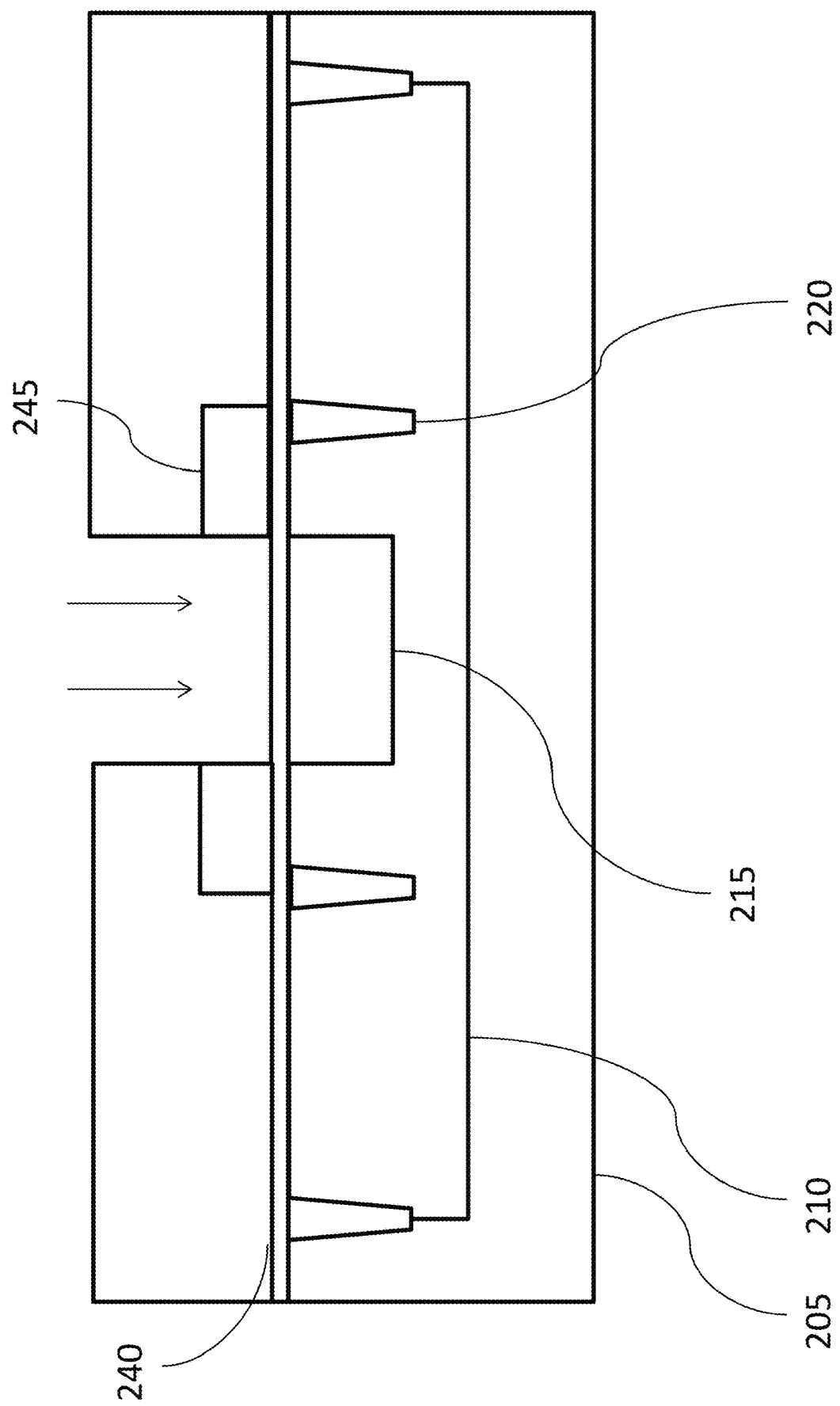
FIG. 9 is a schematic cross-section of the structure of FIG. 8 further comprising an additional well.

FIG. 9 illustrates an initial implantation stage of the p-well 215. Typically, this initial implantation stage involves directing at least one beam of ions (shown by the arrows in FIG. 9) vertically downwards into the drift well 210 so as to at least partially form the p-well 215. This beam of ions is directed to an area of the drift well 210 adjacent to one side of the gate 245 and adjacent to an oppositely facing side of the other gate of the transistor structure 200. Typically, the beam of ions will be directed towards the drift well 210 at an angle substantially perpendicular to a surface plane of the substrate 205 to at least partially form the p-well 215. Following implantation, the p-well 215 will be substantially aligned with respect to the inner-facing edges of the gates as illustrated. The mask 805 may assist in preserving the structure and composition of the gates of the transistor structure 200 during this implantation stage.

Figure 10:
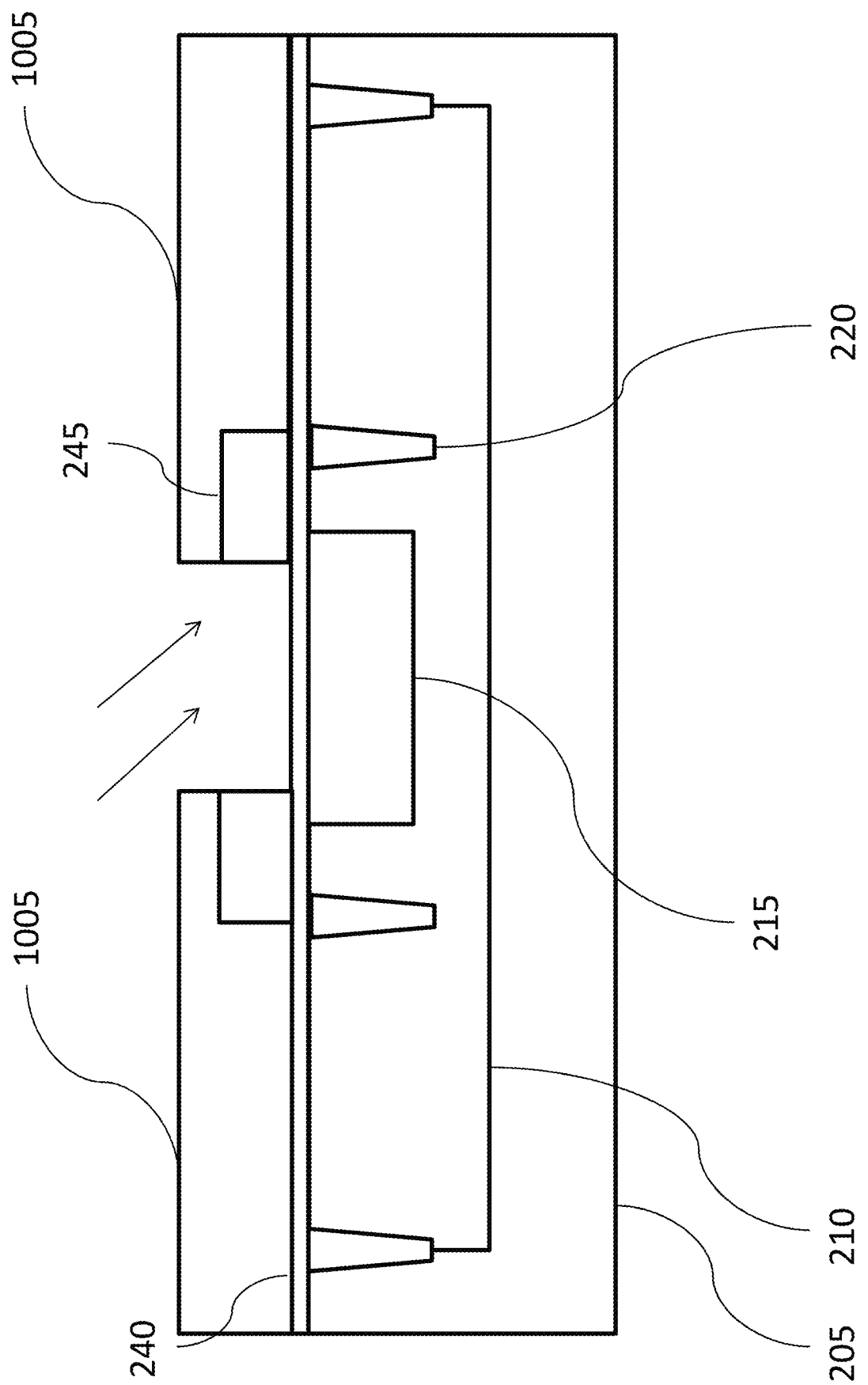
FIG. 10 is a schematic cross-section of the structure of FIG. 9 wherein the additional well has been expanded.

FIG. 10 illustrates a secondary implantation stage of the p-well 215. In some exemplary processes, mask 805 may be removed from the transistor structure 200 prior to the second implantation stage. A new mask 1005 may be formed on the transistor structure 200. The mask 1005 may have the same or very similar positioning on the transistor structure 200 as the previous mask 805. Typically, the new mask 1005 is also composed of photoresist. However, the new mask 1005 may be thinner than the previous mask 805. In some exemplary embodiments, the new mask 1005 is less than or substantially equal to one micrometre in thickness. In other exemplary embodiments, the new mask 1005 is less than or substantially equal to 0.5 micrometres in thickness.

In other exemplary processes, the new mask 1005 may, in fact, be the original mask 805 or a thinned version of the original mask 805. The new mask 1005 may be purposely thinned for the secondary implantation stage. For example, the original mask may be purposely thinned using a chemical mechanical polishing process.

Typically, this secondary implantation stage involves directing at least one beam of ions (shown by the arrows in FIG. 10) from a non-vertical direction (i.e. a tilt implant) into the partially formed-p-well 215 and the drift well 210. That is, the beam of ions is directed towards the transistor structure 200 at an angle substantially offset from a surface normal of the substrate 205. As illustrated by the arrows in FIG. 10, this beam of ions is directed to an area of the drift well 210 adjacent to one side of the gate 245 and (not shown) adjacent to an oppositely facing side of the other gate of the transistor structure 200. This secondary implant constitutes a tilt implant.

During the secondary implantation step, the gate 245 may act as part of a mask in combination with the new mask 1005 in relation to the tilt implant. In other exemplary processes, the gate 245 may act as a mask in isolation. That is, the new mask 1005 may not be present in the secondary implantation step.

By implanting ions at an angle, the ions can penetrate under a portion of the gate 245 to form a portion of the p-well 215 that extends under the gate 245. This portion of the p-well 215 extending under the gate 245 can then form the channel of the transistor 202, once the associated source 230 and drain 225 have been added. In this exemplary process, the step of implanting ions at an angle will be repeated for both sides of the p-well 215 such that, as a result, there is a portion of the p-well 215 extending under both gates of the transistor structure 200.

The utilisation of a new mask 1005 that is thinner than the original mask 805 during the secondary implantation step allows for ions to be directed towards the transistor structure 200 at a greater offset (tilt angle) from the surface normal of the substrate 205. By being able to direct ions towards the transistor structure at a greater "tilt angle" it may be possible for ions to penetrate further under (in a lateral direction) and across a portion of the gate 245 to form a portion of the p-well 215 that extends under the gate 245. With reference to FIG. 10, it can be appreciated that the portion of the new mask 1005 to the left of the partially formed p-well 215 has a shadowing effect on the beam of ions. If the new mask 1005 is not sufficiently thin this shadowing effect may adversely affect the formation of p-well 215, i.e. the portion of the mask 1005 to the left of the partially formed p-well 215 may fully or partially block ions from penetrating under a portion of the gate 245 to form a portion of the p-well 215. In other words, the "window" formed by the two portions of the mask 1005 positioned either side of the area into which the p-well 215 is implanted may be too deep to allow for effective tilted ion implantation. The inventors have appreciated that the thickness of the mask 1005 will affect the range of tilt angles that can be used for the at least one ion beam of the secondary ion implantation step.

The use of an initial implantation step and a secondary implantation step in formation of the p-well 215 is advantageous in that it allows the p-well 215 to have sufficient depth, but at the same time allows for the formation of a suitable channel underneath the gate 245 with minimal or no adverse shadowing effects. By using a relatively thick mask 805 for the initial implantation step, the ions that are directed towards the drift well 210 at an angle substantially perpendicular to a surface plane of the substrate 205 can penetrate deep into the drift well to at least partially form the p-well 215. That is, the mask 805 will provide sufficient protection for the remainder of the partially formed transistor structure during this initial implantation step. A relatively high implant energy can be used during the initial implantation step, and the relatively thick mask 805 provides adequate protection to the gate 245. Having a sufficiently deep p-well will ensure that the on-state resistance of the to-be-formed transistor is predictable. By using a relatively thin mask 1005 for the secondary implantation step, ions can be directed towards the partially formed p-well 215 and drift well 210 at an angle substantially offset from the surface normal of the substrate 205.

In other embodiments, the skilled person will appreciate that the order of the initial and secondary implantation steps may be reversed. That is, at least one beam of ions can first be directed from a non-vertical direction into the drift well 210 to at least partially form the p-well 215. Following this step, at least one other beam of ions can be directed into the partially formed p-well 215 and drift well 210 at an angle substantially perpendicular to a surface plane of the substrate 205 to deepen the p-well 215 in a central region. The mask thickness would be adjusted to suit the implant sequence (thin first, then thick).

Following the formation of the p-well 215, the transistor structure 200 may be subject to rapid thermal processing. In particular, the transistor structure 200 may be subject to rapid thermal annealing or "spike annealing". The purpose of this processing is to activate the dopants in p-well 215 present from the earlier ion implantation stages. The rapid thermal annealing completes the fabrication of the p-well 215 as a region of p-type doping polarity. The annealing may also activate other regions within the transistor structure 200 such as the drift well 210, or other structures present in or on other (not shown) portions of the substrate 205.

Typically the rapid thermal annealing process would subject the transistor structure 200 to a temperature of 1000 degrees Celsius for approximately 10 seconds. This short exposure time at a high temperature exposes the p-well 215 of the transistor structure 200 to relatively low overall amounts of thermal energy compared to other conventional annealing processes which typically last for several hours. The p-well 215 being exposed to a low amount of thermal energy is advantageous in that it minimises unwanted changes to the extent of the p-well 215 within the transistor structure 200. In turn, use of rapid thermal processing reduces the possibility of misalignment errors occurring in the fabrication of the transistor structure 200. In particular, the use of rapid thermal processing means that the position of the near side and far side edges of the p-well 215 can be predictable to a relatively high level of precision, or at least to a higher level of precision than if the p-well 215 was exposed to greater amounts of thermal energy.

Figure 11:
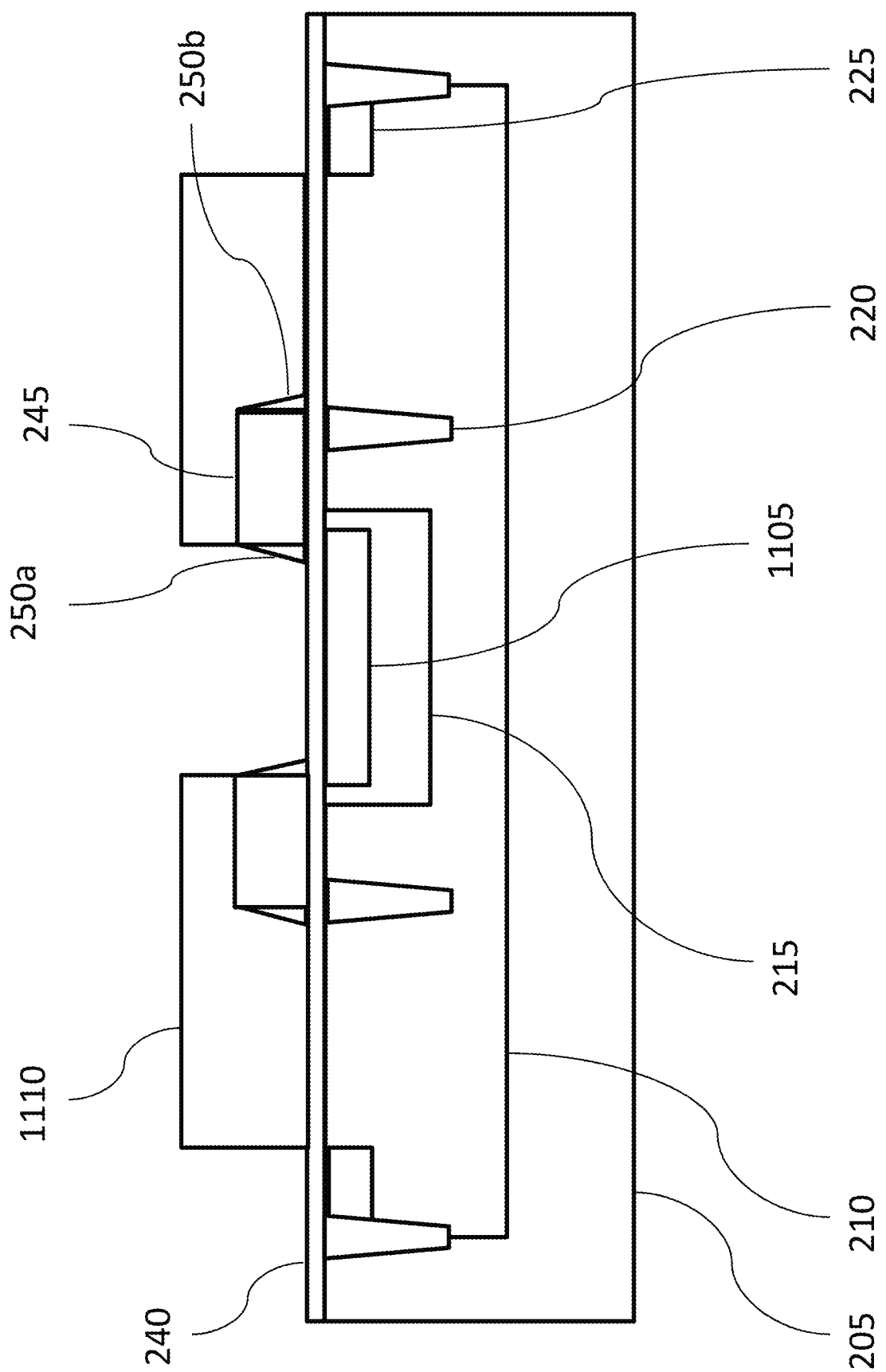
FIG. 11 is a schematic cross-section of the structure of FIG. 10 further comprising a region formed in the additional well.

FIG. 11 illustrates the step of a region 1105 of n-type doping polarity being formed in the transistor structure 200 following the formation of the p-well 215. The region 1105 is formed in the p-well 215 between the two gates of the transistor structure 200. A mask 1110 covering the gates and a portion of the drift well 210 and substrate may be used when forming the region 1105 of n-type doping polarity. In the formation of the region 1105, the gate 245 may be used as a mask in combination with the mask 1110. The region 1105 may be formed by means of vertical or non-vertical ion implantation.

Prior to application of the mask 1110, insulating portions or sidewall spacers 250a, 250b may be added to the far side and/or near side of the gate 245. Corresponding portions may be added to the gate of the to-be-formed adjacent transistor 201. The insulating portion 250a added to the near side edge of the gate 245 may define a new near side edge of the gate 245. The insulating portion 250a may be used as (part of) a mask in combination with the mask 1110 in the formation of the region 1105 of n-type doping polarity. In particular in the event that the region 1105 of n-type doping polarity is formed using a non-vertical ion beam, the insulating portion 250a may limit the penetration of ions underneath gate 245 from the beam. In turn, this may contribute to the lateral interface of the region 1105 with the p-well 215 being offset from the lateral interface between the p-well 215 and the drift well 210.

In other exemplary embodiments the mask 1005 may be reused for the purpose of implanting the region 1105 of n-type doping polarity. In this case, application of the insulating portions 250a, 250b would typically occur after removal of the mask 1005, once the region 1105 of n-type doping polarity is present in the structure.

Drains 225 may be added to the transistor structure 200 at this stage. The mask 1110 may be configured so as to expose portions of the drift well 210 into which drains can be implanted. The drain 225 of the transistor 202 is implanted at the edge of the drift well 210. A drift region of the transistor 202 is thereby defined. The drift region extends from the drain 225 to the closest lateral interface between p-well 215 and the drift well 210.

Figure 12:
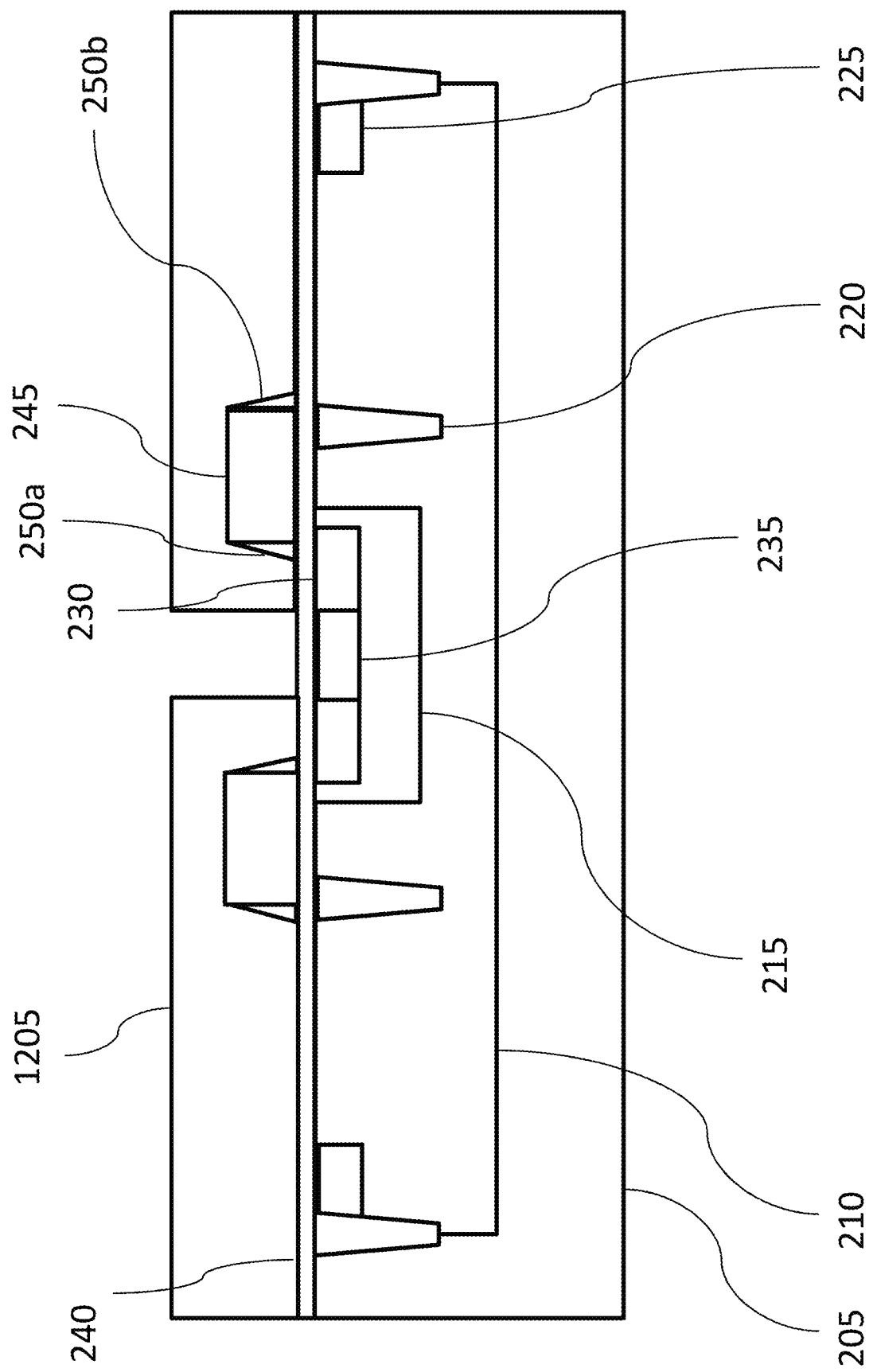
FIG. 12 is a schematic cross-section of the structure of FIG. 11 with a mask applied to it.

Considering FIGS. 11 and 12, the region 1105 is used in the process of fabricating a source 230 of the transistor 202 and a source of the oppositely facing transistor 201. This is achieved by the portion 235 of p-type doping polarity being formed in a middle portion of the region 1105. The portion 235 of p-type doping polarity isolates side portions 230 of the region 1105 from one another. The two side portions 230 form the sources of the transistors 201, 202 of the transistor structure 200.

The transistor structure 200 may have a shape generally resembling a ring. In this case, the two side portions 230 together would resemble a ring-like structure and would not be discrete portions. This ring-like structure would be disposed within the transistor structure 200 and would follow the overall ring-like shape and configuration of transistor structure 200. The two side portions 230 may maintain a substantially constant lateral separation between one another within the overall ring of the transistor structure 200. The general shape of the ring-like structure may resemble that of a race track. In particular in the case of such a ring-like structure the tilt implant used in the formation of the p-well 215 may be performed by directing an ion beam in a non-vertical direction with respect to the top surface of the device and rotating the device about an axis which is perpendicular with respect to the top surface. In this manner the ion beam will be directed "under" the gates 245 of both transistors 201, 202.

As shown in FIG. 12, a further dedicated mask 1205 may be used when implanting the portion 235 of p-type doping polarity into the region 1105. The dedicated mask 1205 extends over the gates and a portion of the substrate 205, the drift well 210 and the p-well 215. The dedicated mask 1205 has a recess above a central portion of the region 1105, thereby allowing the implantation of the portion 235 of p-type doping polarity into the region 1105.

Following the formation of the portion 235, the source 230 of the transistor 202 is defined. The source 230 is self-aligned with respect to the gate 245, and so the lateral interface between the source 230 and the p-well 215 is also self-aligned. Therefore, as the lateral interface between the source 230 and the p-well 215 defines the near-side edge of the channel, formation of the source 230 completes the fabrication process and definition of the self-aligned channel 255 and the transistor 202.

As will be appreciated from the above description, the channel is self-aligned (or fully self-aligned) because both of its lateral interfaces with other components of the transistor 202 (i.e. the drift well 210 and the source 230) are formed relative to the position of the near side edge of the gate 245. The far side edge of the channel is formed during the secondary implantation stage of the p-well 215, where at least one beam of ions is directed into the partially formed-p-well 215 and the drift well 210 from a non-vertical direction (see FIG. 10). In this secondary implantation stage, the gate 245 and, in particular, the near side edge of the gate 245 act as a mask. The gate 245 effectively provides a barrier to the beam of ions. As the beam of ions is directed towards the partially formed-p-well 215 and the drift well 210 from a non-vertical direction, some ions are implanted underneath the gate 245. The degree of penetration of the beam of ions under the gate 245 and past the near side edge of the gate 245 can be selected during this implantation stage by appropriate choice of implantation parameters whilst using the near side edge of the gate 245 as a positional reference. This in turn means that the extent and location of the p-well 215 underneath the gate 245 can also be selected during this implantation stage using the near side edge of the gate 245 as a positional reference.

The near side edge of the channel is formed when the region 1105 of n-type doping polarity is formed in the transistor structure 200 (see FIG. 11). Again, the gate 245 (if applicable in conjunction with sidewall spacers 250a) can act as a mask/barrier during this formation stage and be used to control the formation of boundaries of the region 1105. The position of the lateral interface of the region 1105 with the p-well 215 can therefore also be selected using the near side edge of the gate 245 (and sidewall spacers 250a) as a positional reference.

The position of the near side and far side edges of the channel relative to the near side edge of the gate 245 can therefore be predictable to a relatively high level of precision, or at least to a higher level of precision than in some conventional techniques. The near side edge of the gate 245 being a positional reference for both the near side and the far side edge of the channel means that the distance between these two edges of the channel can also be calculated to a relatively high level of precision, or at least to a higher level of precision than in some conventional techniques. This advantage can feed back into the fabrication process described above and enable LDMOS transistor structures comprising shorter channels to be produced with lower margins for error than some conventional fabrication processes.

Being able to select, calculate and predict the channel length of an LDMOS transistor more precisely reduces the likelihood of misalignment errors during the fabrication process. The exemplary methods as described herein can be used to produce transistor structures with lower margins of error. As the gate 245 is integral to the formation of the far side and near side edges of the channel, the possibility of the gate being misaligned with respect to the channel of the transistor 202 can be eliminated. This in turn means that embodiments enable transistors to be manufactured with a relatively short channel length. Such short channel lengths may not be achievable (or not reliably achievable) according to some conventional techniques since such conventional techniques may need to allow for greater alignment errors and therefore deliberately design the channel longer.

The formation of the p-well 215 at a relatively late stage in the fabrication process is also advantageous in producing LDMOS transistors with more precise channel lengths and with a reduced likelihood of misalignment errors occurring. As the p-well 215 is formed after formation of the insulating layer 240, the shallow trench insulators 220 and the gates 245 of the transistor structure 200, it is not exposed to any thermal energy that is transferred to the transistor structure 200 as a result of those components being formed. Therefore, the p-well 215 is typically only exposed to one instance of rapid thermal processing in which its borders with the remainder of the transistor structure 200 may be changed. As the channel within the p-well 215 is exposed to less overall thermal energy in the transistor structure 200 fabrication process, its borders with the remainder of the transistor structure 200 can be predicted to a higher level of precision than in conventional LDMOS fabrication processes. In turn, this enables LDMOS transistors with shortened channel lengths to be produced without increased likelihood of misalignment errors occurring during the fabrication process.

In an alternative embodiment, the insulating portions 250a, 250b may be added to the gate 245 following the formation of the portion 235 and removal (or partial removal) of the mask 1005.

Figure 13:
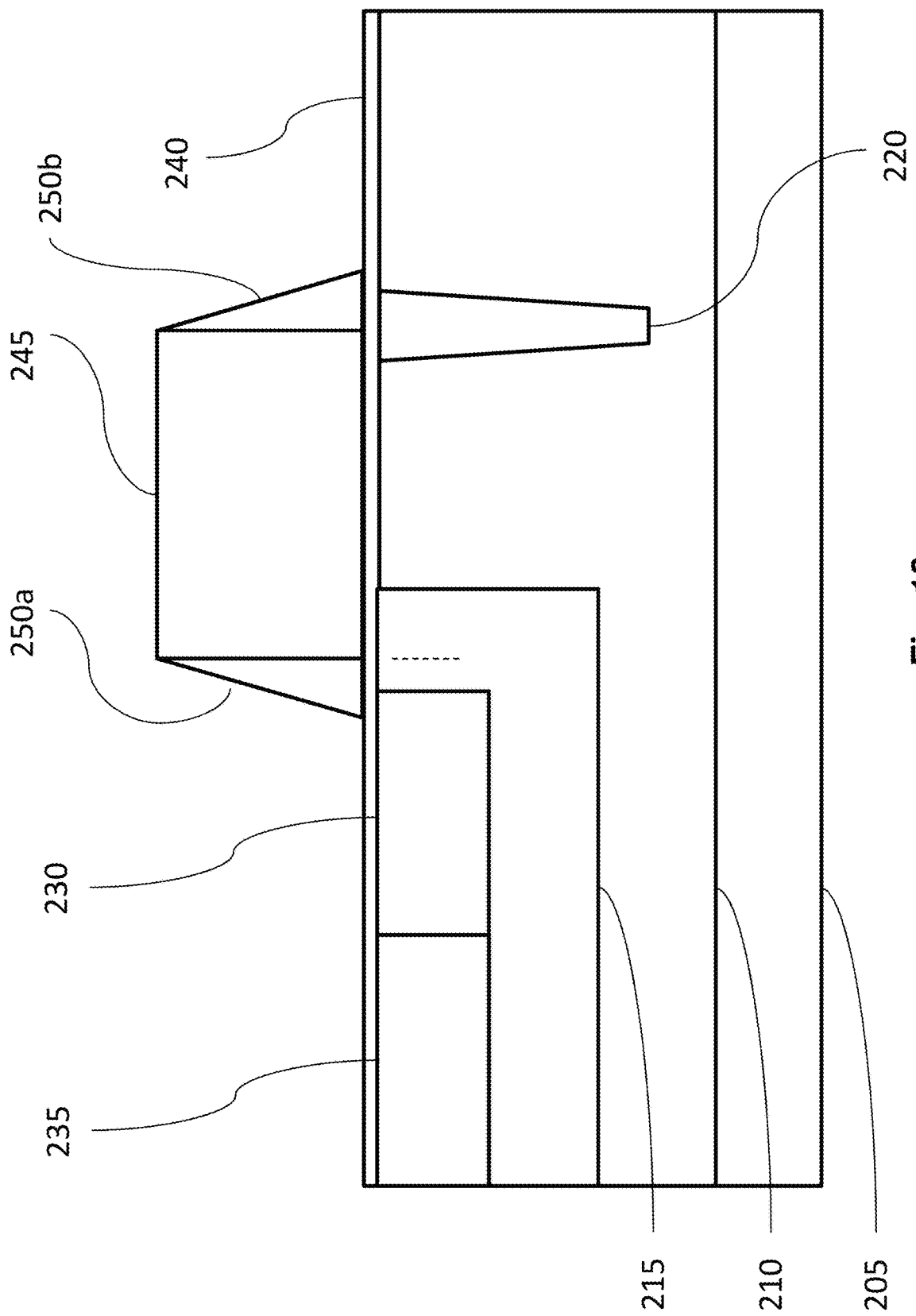
FIG. 13 illustrates a schematic cross-section of a portion of an exemplary transistor structure.

FIG. 13 illustrates a scenario in which the insulating portions 250a, 250b are applied to the gate 245 prior to formation of the region 1105 of n-type doping polarity in the p-well 215. In this case, the presence of the insulating portions 250a, 250b may present a problem in that the lateral border of the region 1105 (and therefore the subsequently defined source 230) within the p-well 215 is not underneath the gate 245. That is, there is a portion of the p-well 215 (left of the dashed line shown in FIG. 13) adjacent to the source 230 which is not below the gate 245. In this scenario, even if a (normally) sufficient voltage is applied to the gate 245 and a conductive path is formed in the channel of the transistor (through an inversion layer), a (sufficiently large) current may not be able to flow between the source 230 and the drain 225 of the transistor. This is because the electric field produced by the voltage applied to the gate 245 may not permeate (sufficiently) through this particular portion of the p-well 215 directly adjacent to the gate 245. That is, an inversion layer may not form in this identified portion and may not allow a conductive pathway for the appropriate charge carriers from the source 230 of the transistor 202 to the drain to be available, even when voltage is applied to the gate 245 and the channel of the transistor is "open".

Figure 14:
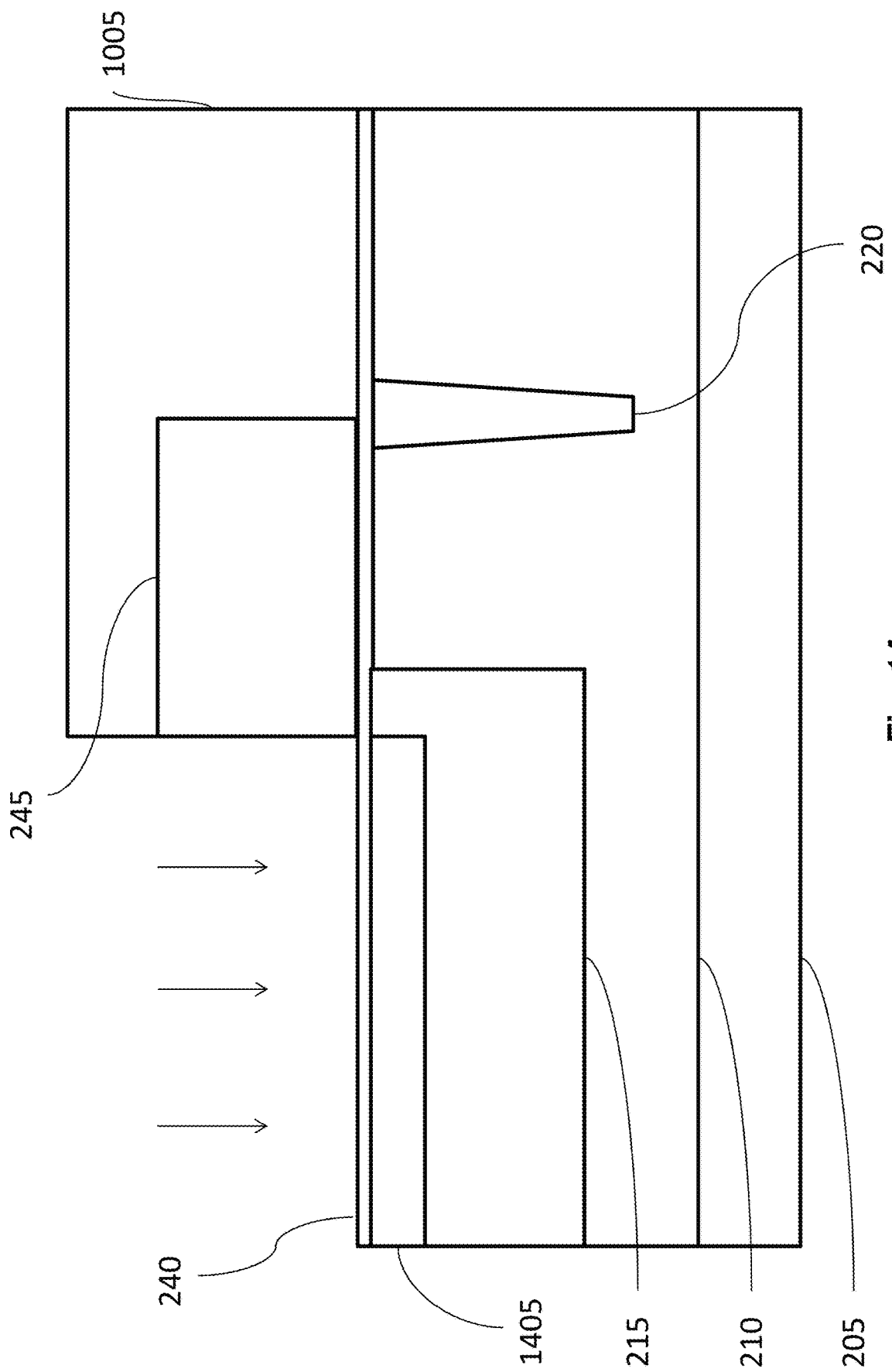
FIG. 14 illustrates the application of an additional layer in the fabrication process of an exemplary transistor structure.

To address the above outlined problem, in some embodiments, a relatively shallow layer 1405 of n-type doping polarity may be implanted in the p-well 215 prior to application of the insulating portions 250a, 250b to the gate 245. This layer would also be implanted prior to implantation of the region 1105 of n-type doping polarity in the p-well 215. FIG. 14 illustrates the implantation of such a layer 1405 into the p-well 215. The implantation of this shallow layer 1405 may involve directing at least one beam of ions vertically downwards into the p-well 215. This layer 1405 may be implanted immediately after the formation of the p-well 215. A mask, such as the mask 1005 used in the formation process of the p-well 215 itself, may also be used in the implantation of this layer 1405. Alternatively, a separate mask or no mask may be used in this implantation step. In some embodiments, a tilt implant step may also be carried out in the formation of the layer 1405 within the p-well 215.

Figure 15:
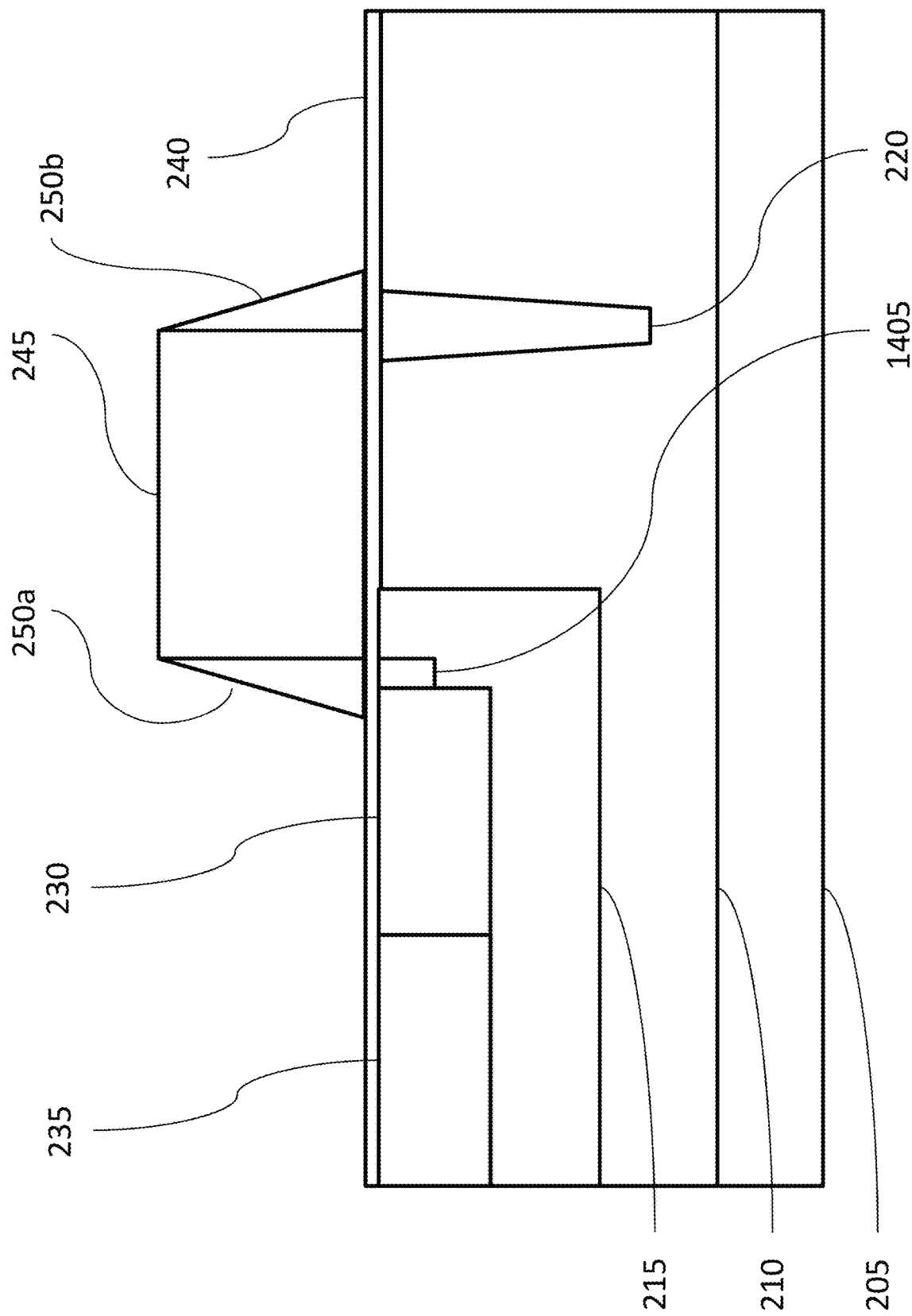
FIG. 15 illustrates a portion of a completed exemplary transistor structure comprising an additional layer.

Following the implantation of layer 1405, the insulating portions 250a, 250b may be applied to the gate. In addition, the region 1105 of n-type doping polarity may also be implanted in the p-well 215 as described previously with reference to FIG. 11. FIG. 15 illustrates a portion of the transistor structure following the application of the insulating portions 250a, 250b, the region 1105 and the portion 235 within the region 1105. Once again, FIG. 15 illustrates that, at first, the layer 1405 is applied followed by implantation of the region 1105 and then the portion 235 (in order to define the source 230). The region 1105 is deeper than the layer 1405, but is of the same doping polarity type. Essentially, the region 1105 is overlaid on and below a portion of the layer 1405. However, due to the presence of the insulating portions 250a, 250b on the gate 245 during the implantation of the region 1105, the region 1105 is not overlaid on the entirety of the layer 1405 (i.e. the outermost portions of layer 1405 project laterally beyond region 1105). A portion of the original layer 1405 underneath the insulating portion 250a (and potentially underneath a portion of the gate 245 itself) remains substantially unchanged. As illustrated in FIG. 15, once a source 230 is defined in the region 1105, this outermost portion of the layer 1405 present under the insulating portion 250a (and potentially underneath a portion of the gate 245 itself) can provide a conductive pathway for the relevant charge carriers from the source 230 to the channel of the transistor (i.e. to the portion of the p-well 215 immediately underneath the gate 245). In effect, this portion of the layer 1405 may provide functionality equivalent to that of a lightly doped source extension implant.

Features and advantages of certain embodiments will now be explained with reference to FIGS. 16 to 25. These features and advantages are applicable to at least some of the embodiments described above.

Figure 16:
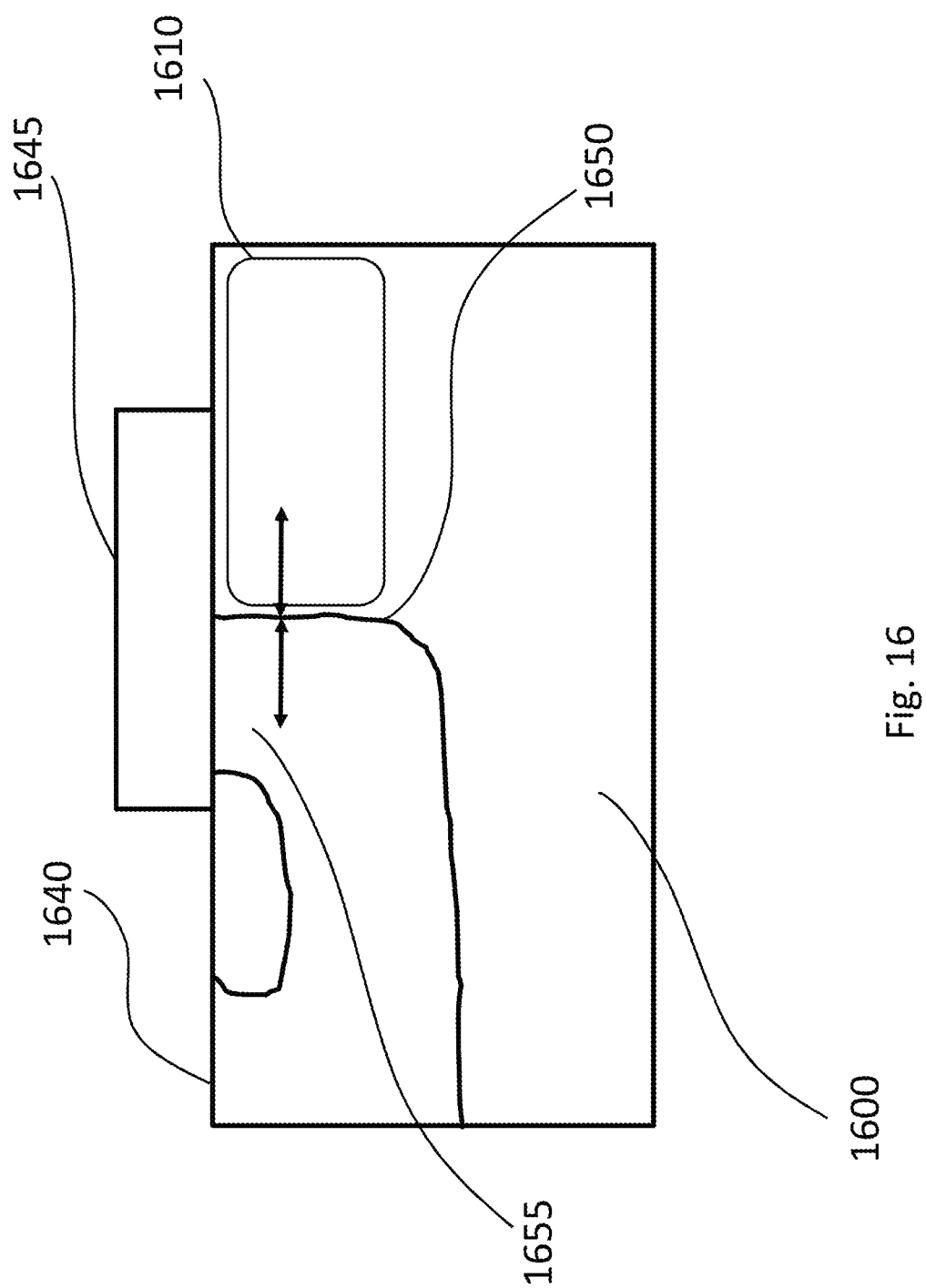
FIG. 16 illustrates a schematic cross-section of a conventional transistor.

FIG. 16 shows a simplified section through a portion of a conventional HV transistor. Not all features of this conventional transistor will be described as the skilled person will be familiar with these.

The transistor has a substrate 1600, on which a gate 1645 is formed. Two regions are distinguished within the substrate 1600: a region 1655 (herein referred to as channel region), in which the channel is formed, and a drift region 1610, whose approximate location is indicated by a rectangle with rounded corners. Both of these regions can be formed by ion implantation. In an ideal case they meet at a common interface 1650 substantially perpendicular to the top surface 1640 of the transistor.

In order to manufacture this type of conventional transistor the substrate 1600 is provided first. The channel region 1655 and the drift region 1610 are then formed, one after the other, by ion implantation. A separate mask is used in order to form each of these regions. The gate 1645 is subsequently formed on top.

Due to limitations in implantation and mask techniques, the implantation of regions is commonly subject to positional variations, e.g. of about 100 nm. Since each of the channel region 1655 and the drift region 1610 are formed using separate (different) masks, the position of the boundary of each region is subject to a variation as indicated by two double-headed arrows in FIG. 16. This means that it is possible that these regions don't meet or that they overlap, leading to a relatively high failure rate. The problem is exacerbated the more miniaturized the transistors are. Similarly, it is difficult to predict whether, for a given manufacturing process, the channel region 1655 and the drift region 1610 don't meet, meet at a common interface 1650, or overlap.

These problems are addressed in embodiments by: 1) The use of a "global drift region" 210—global in the sense that it extends (or can extend) under the entire gate and/or the channel region, as described in connection with FIGS. 2 to 15; indeed, since the drift region 210 is of a global nature the p-well 215 is implanted in regions which, prior to implantation of the p-well 215, were part of the global (n-)drift region 210; and/or 2) Using an edge of the already-formed gate as a reference point for the implants which define both channel edges, i.e. forming both channel edges in a self-aligned manner; and/or 3) Use of a two-step implant (such as one perpendicular and one tilt implant, see FIGS. 9 and 10) in order to form p-well 215 (in which the channel region will be located); and/or 4). Thinning of the mask (805/1005) used for implanting the p-well 215.

The thinning of the mask used for implanting the p-well 215 has already been described above, including the fact that the thinner mask may reduce the shadowing effect during the tilt implant. However, the thinning of the mask has another beneficial effect, as will now be described.

In certain embodiments the second part of the implanting of the p-well 215, i.e. the implant using the thinner mask such as 1005 in FIG. 10, comprises performing not only the tilt implant indicated by non-vertical arrows (as in FIG. 10) but a further, vertical implant. The inventors envisage that this further vertical implant would be shallower than the first vertical implant, which uses the thicker mask 805 shown in FIGS. 8 and 9. For ease of reference, and by way of illustration only, the implants will be referred to as:

first implant=the deep, vertical implant using the thicker mask 805 (FIGS. 8 and 9)

second implant=tilt implant using the thinner mask 1005 (FIG. 10)

third implant=shallow, vertical implant using the thinner mask 1005 of FIG. 10 (implant not indicated by arrows in FIG. 10)

It will however be appreciated that the implants do not need to be performed in this order, that the implants do not need to be precisely vertical and that more than three implants may be performed. It is however advantageous to perform at least the second and third implants using the same mask (i.e. in the same photo step).

In order to better understand the benefit of using a thinner mask for the second and in particular the third implant it is useful to consider in more detail how the implants are performed and what shape the masks tend to have.

FIG. 17 shows a simplified section through a partially completed HV transistor with gate poly 1745 and STI 1720. A photoresist (PR) mask 1705 is deposited on a portion of the gate poly 1745 and the STI 1720 for use in an ion implant illustrated by vertical arrows 1707, 1708 and 1709. Typically, the edge 1706 of the mask 1705 is not precisely vertical and can instead be approximated by a sloping surface. As a result of this, portions (1709) of the ion beam will hit the sloping surface 1706 at a higher level than other portions (1708) of the ion beam, whereas some portions (1707) will not hit the mask 1705 at all and will instead hit the gate poly 1745 (assuming a portion of the gate poly 1745 is not covered by the mask 1705). In this context it will be understood that due to the stopping power of the PR material against penetration of the ions the depth to which ions will penetrate into the PR mask 1705, the gate poly 1745 or the substrate underneath will depend on the horizontal position of the ions within the beam, that is, ions 1708 hitting the sloping surface 1706 at a lower level will penetrate to a greater depth than ions 1709 hitting the sloping surface 1706 at a higher level but will penetrate to a shallower depth than ions 1707 hitting the gate material directly.

FIG. 18 illustrates another factor—mask overlay error (OLE)—which plays a role in terms of the penetration depth of the ions. FIG. 18 shows a portion of the partly completed device of FIG. 17. Only the gate poly 1745 and the PR mask 1705 with its sloping edge 1706 are shown. Also shown in dashed lines are alternative positions of the sloping edge 1706. Due to limitations of existing manufacturing processes it is difficult, if not impossible, to align the lower end of the sloping edge 1706 precisely with an edge of the gate poly 1745. As a result, manufacturing process parameters may be set such that the target location of the lower end of the sloping edge 1706 is somewhat recessed with respect to the edge of the gate poly 1745, as illustrated by the solid line 1706 in FIG. 18, so that the actual location of the sloping edge 1706 may vary within the range defined by the dashed lines. This variation—ultimately resulting from mask OLE—will again have an impact on the penetration depth of ions, as will further be explained with reference to FIGS. 19 to 22.

Figure 19:
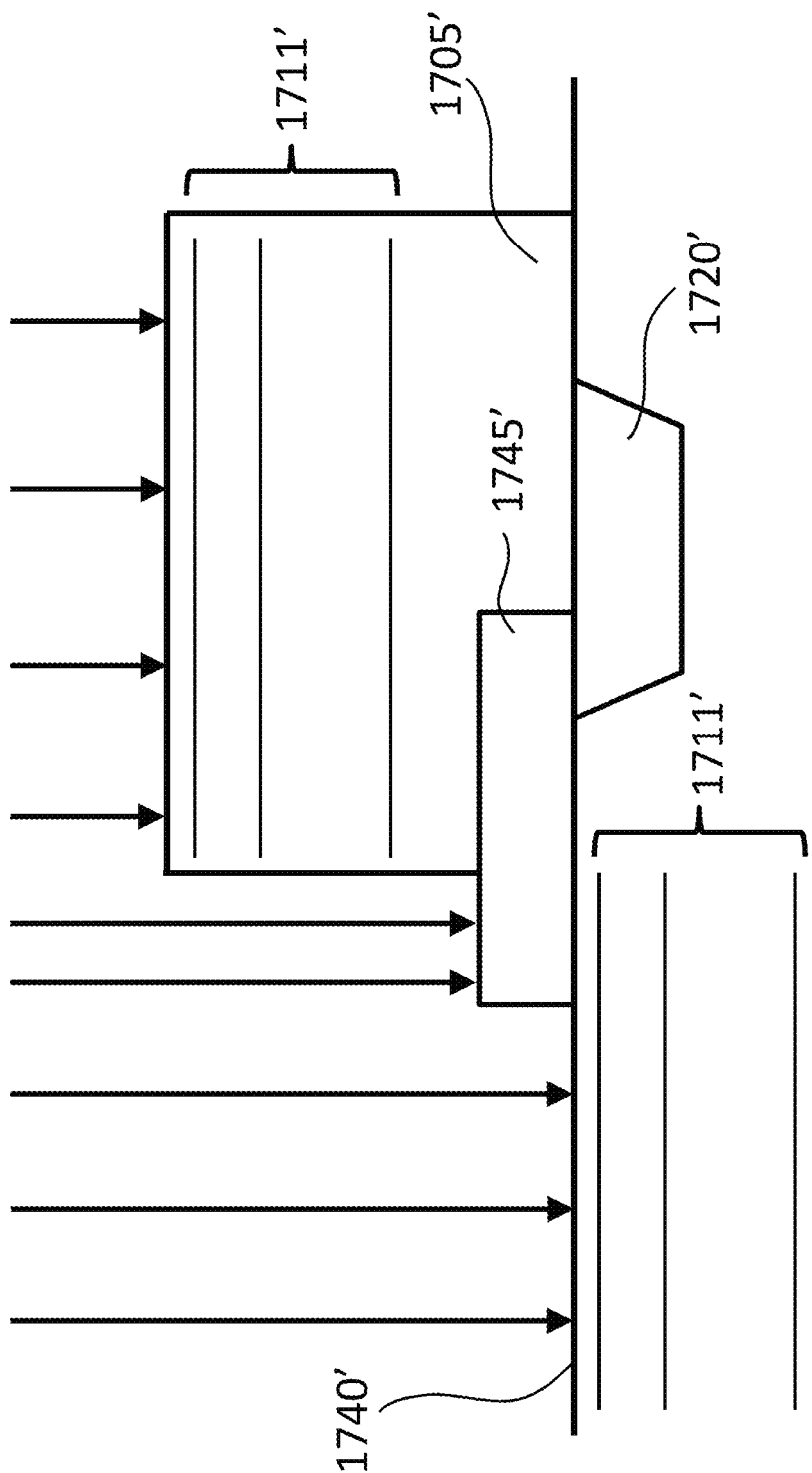
FIG. 19 illustrates a schematic cross-section of a portion of an ideal, partially completed transistor which is being subjected to an implant.

FIG. 19 illustrates an ideal PR pattern in a partially completed device. Gate poly 1745', STI 1720' and PR mask 1705' are shown. The PR mask is shown as having vertical edges, which is not usually achievable with existing manufacturing processes.

Also shown in FIG. 19 are a series of arrows illustrating the ion implant beam hitting the semiconductor surface 1740', gate poly 1745' and PR mask 1705'. The horizontal lines 1711' within the substrate and PR material 1705' indicate the peak of the implant depth for different implant species, i.e. the lines indicate, by way of example, at what depth the peak concentration of different implant species can be found. In this ideal scenario the peak concentration lines run parallel to the device surface 1740', whereby at the location of the edge of the PR mask the lines make a step from a depth within the substrate to a depth within the PR mask.

Figure 20:
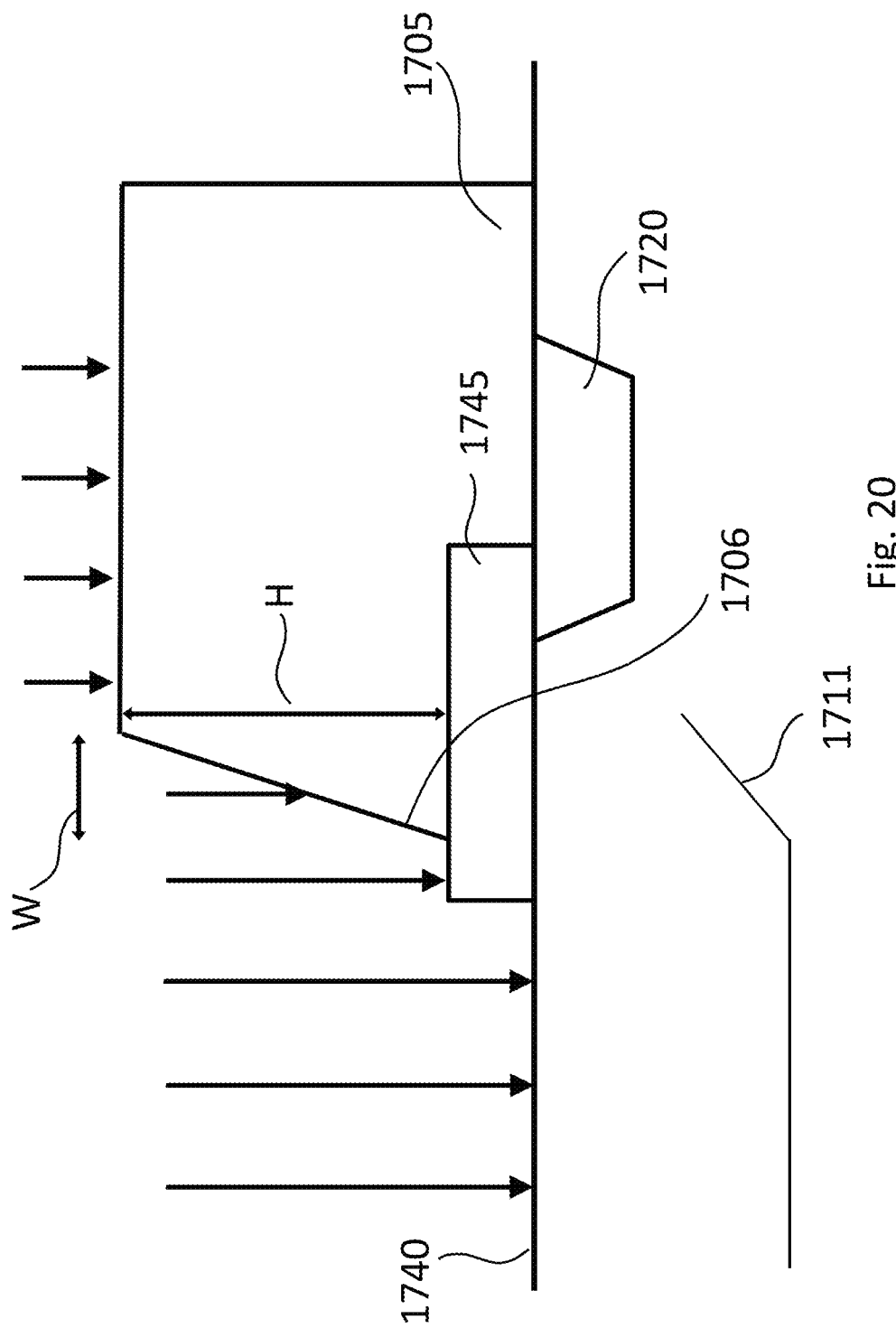
FIG. 20 illustrates a schematic cross-section of a portion of a partially completed transistor which is being subjected to an implant.

FIG. 20 shows a more realistic scenario—basically the same as that of FIG. 17. A series of arrows illustrating the implant beam are again shown. Also indicated is the height H and width W of the sloping edge 1706. Line 1711 within the substrate indicates an example of the depth at which the peak concentration of one particular implant species can be found. Unlike in the less realistic case of FIG. 19, the peak concentration line 1711 slopes upwards where it extends under the sloping edge 1706 of the PR mask. FIG. 20 can be regarded as illustrating the first implant described with reference to FIGS. 8 and 9, i.e. using a relatively thick PR mask (805 in FIGS. 8 and 9; 1705 in FIG. 20) and a relatively high implant energy. Assuming that the implant parameters are chosen appropriately, the upwardly sloping "tail", i.e. the right-hand portion of peak concentration line 1711, will not reach the semiconductor surface 1740 (which would be detrimental).

Figure 21:
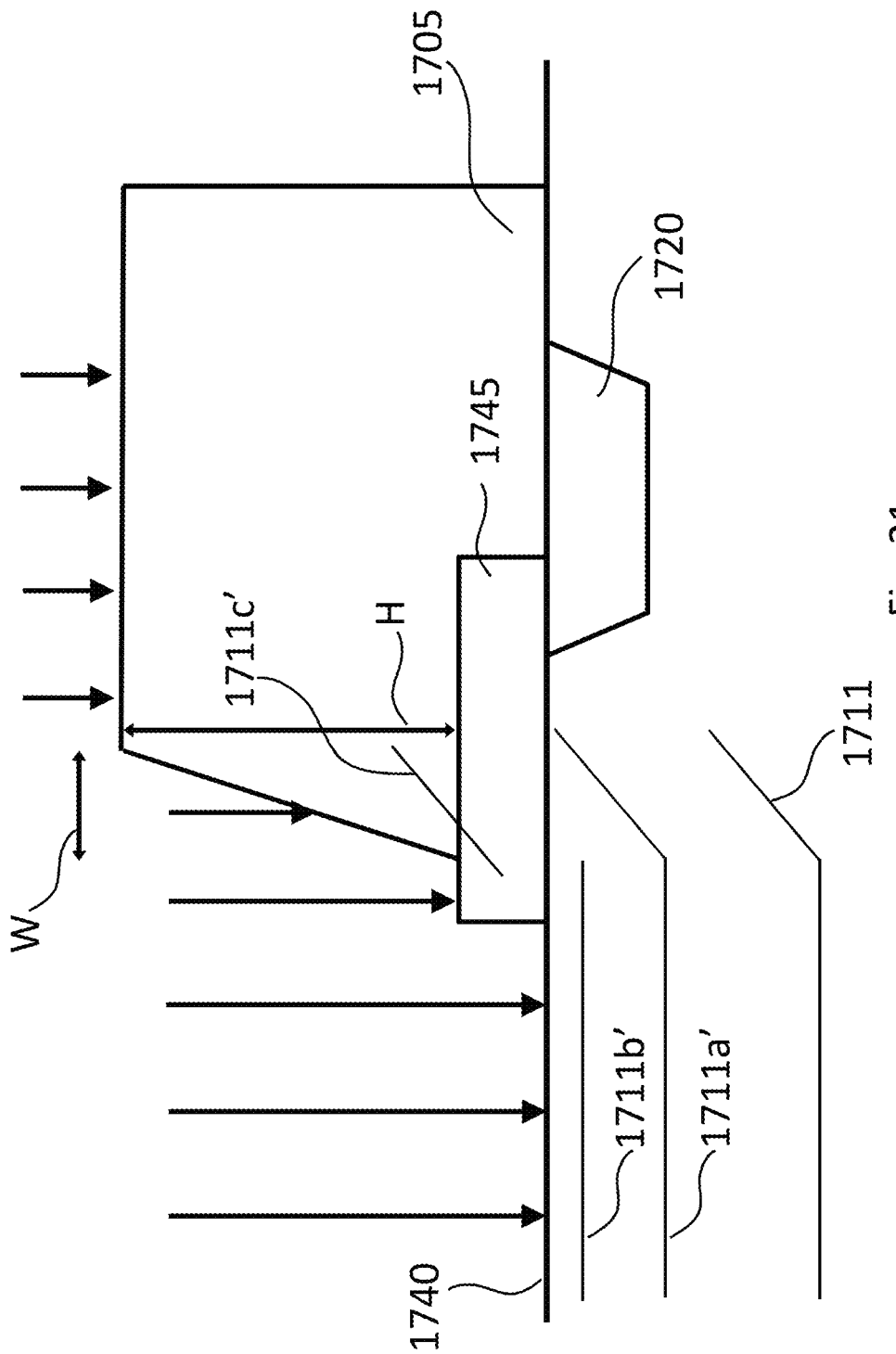
FIG. 21 illustrates a schematic cross-section of a portion of a partially completed transistor which is being subjected to an implant.

FIG. 21 illustrates what might happen if additional, lower energy implants were performed using the thick PR based implant scheme of FIG. 20. Line 1711 indicates the peak concentration line resulting from the (relatively high energy) implant of FIG. 20. Two additional implants are shown as having been performed in FIG. 21, resulting in peak concentration lines 1711a' and 1711b' and 1711c'. The lowest energy implant is chosen such that the PR mask 1705 and the gate poly 1745 block the ions sufficiently so that the upwardly sloping tail 1711c' does not reach the substrate. The corresponding left portion of the topmost peak concentration line 1711b' extends in the substrate. The locations of both portions 1711b' and 1711c' are satisfactory from a manufacturing point of view, i.e. they do not adversely affect the performance of the device, at least not to a significant extent. However, the peak concentration line 1711a' associated with an intermediate implant energy may be problematic since the implant energy may be such that the PR mask 1705 and the gate poly 1745 do not block the ions sufficiently. As a result the upwardly sloping tail of line 1711a' may reach the semiconductor surface 1740 of the device, or it may come very close to it, both of which would adversely affect the performance of the device.

Figure 22:
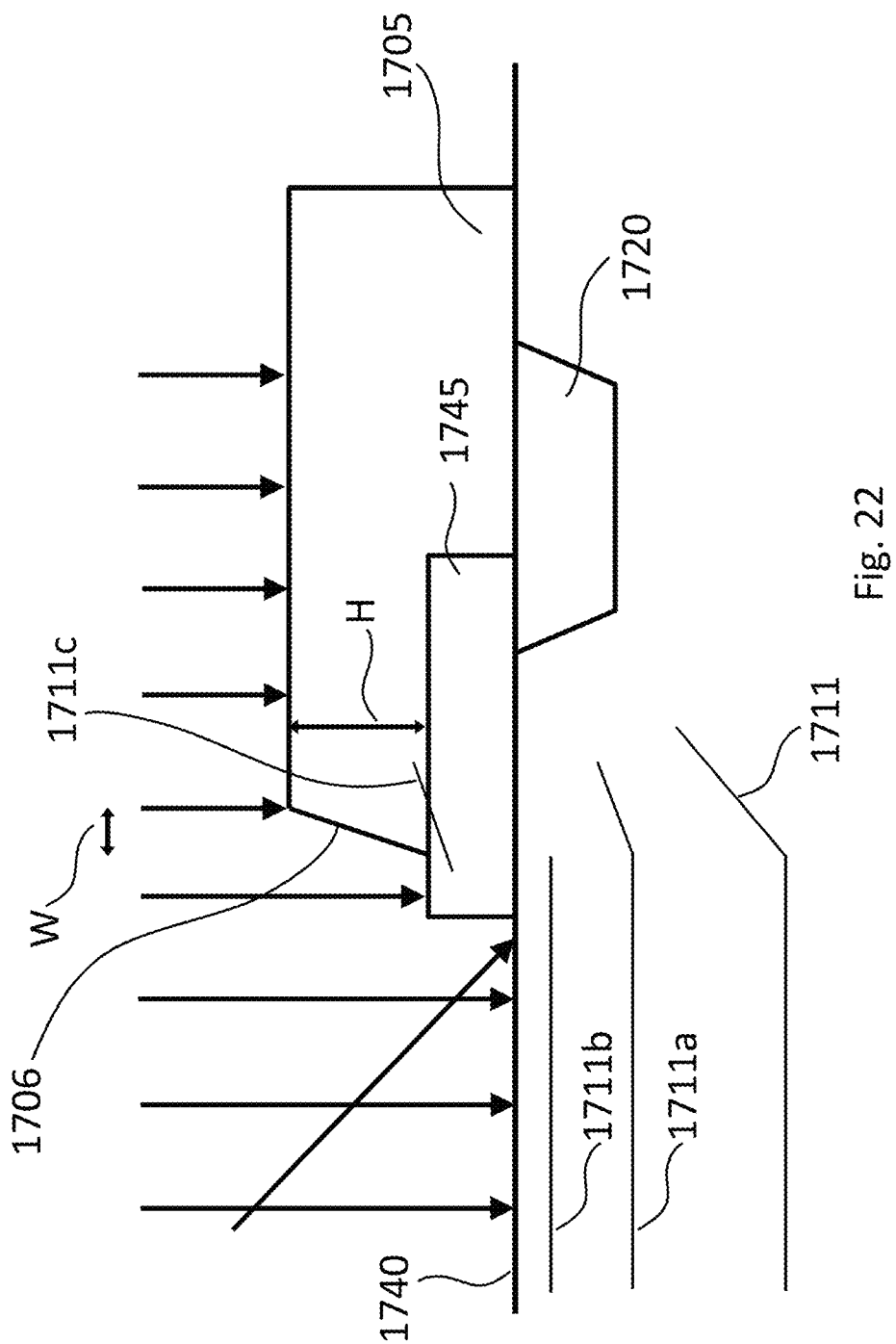
FIG. 22 illustrates a schematic cross-section of a portion of a partially completed transistor which is being subjected to an implant in accordance with an embodiment of the present invention.

FIG. 22 is similar to FIG. 21 in that it also illustrates two additional implants as indicated by peak concentration lines 1711a and 1711b and 1711c. Line 1711 again indicates the peak concentration line resulting from the previously-performed, relatively high energy implant of FIG. 20. The key difference when compared with FIG. 21 is that the PR mask 1705 has been thinned, as also described with reference to FIG. 10. Whilst the inclination of the sloping edge 1706 has not necessarily changed when compared with FIG. 20 (and may therefore also be the same as that used in the comparative example of FIG. 21), the height H and width W of the sloping edge have been reduced proportionally to the reduction in mask thickness. This has the effect that the upwardly sloping tails of the lower energy implants, i.e. the right-hand portion of line 1711a as well as line 1711c, are shorter and shallower than the corresponding tails in FIG. 21. This in turn means that the upwardly sloping tail of line 1711a does not come too close to the semiconductor surface 1740 of the device, which may improve the reliability of the device.

Additionally, if the horizontal position of the sloping edge 1706 varies (from one device to another, or from batch to batch) as explained with reference to FIG. 18, the resulting variation in the location of the upwardly sloping tails of peak concentration lines 1711a and 1711b and 1711c has less of an impact than in the scenario of FIG. 21 since these tails do not come close to the semiconductor surface 1740 of the device. Again, this may improve the reliability of the device. The variation in the location of tail 1711c for example does not (significantly) affect the Si surface (and hence the device performance) as the corresponding implant(s) is/are such that the tail 1711c is contained above the semiconductor surface 1740 (i.e. in the PR 1705 and/or gate polysilicon regions 1745).

FIG. 22 shows a series of vertical arrows and a non-vertical arrow. These together are intended to illustrate the second implant step (generally explained with reference to FIG. 10). That is, as part of the second implant step, in at least some embodiments it is envisaged that a vertical and a tilt implant are carried out—typically with lower energy than in the first implant step (FIGS. 9 and 20). Whilst only one inclined arrow is shown in FIG. 22 for improved clarity, it will be understood that the tilt implant is carried out in a substantially uniform manner over a sufficiently large area.

Since the tilt implant is inclined with respect to the vertical direction, the sloping nature of edge 1706 and the potential variation of its horizontal position (as explained with reference to FIGS. 17 and 18) will affect the location of the implant less than is the case for a vertical implant. The effect which the sloping nature of edge 1706 and the potential variation of its horizontal position has on the vertical implant (as part of the second implant step illustrated in FIG. 22) is reduced, as explained above, as a result of the reduced thickness of PR mask 1705.

Figure 23:
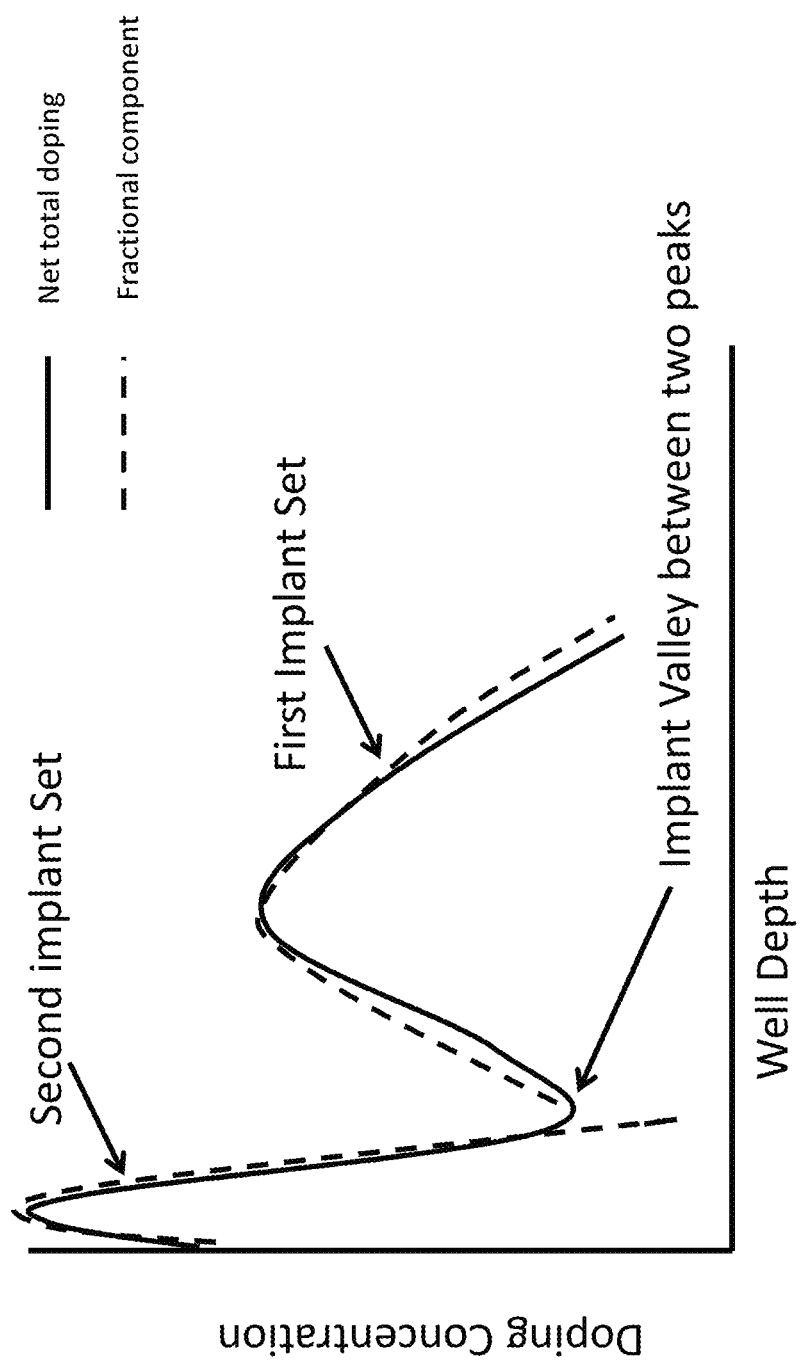
FIG. 23 illustrates a doping profile of a transistor in accordance with an embodiment of the present invention.

FIG. 23 shows a graph schematically plotting the doping concentration of a transistor according to an embodiment in dependence on the depth (i.e. the depth under the semiconductor surface 1740). Two distinct peaks can be recognised, with a significant valley between these peaks, resulting in a double-hump profile. The right-hand peak, at a greater depth, results from the first implant step described with reference to FIGS. 9 and 20. The left-hand peak, at a shallower depth, results from the second implant step described with reference to FIGS. 10 and 22. In certain embodiments the left-hand peak is at least about half an order higher than the right-hand peak. Also, in certain embodiments the right-hand peak is separated from the left-hand peak by at least about 4-5 times the depth of the left-hand peak such that these profiles are effectively decoupled. This may help to reduce any negative effects which any overlay errors may have on the performance of the transistor, in particular at very short channel lengths.

It is useful to compare a conventional transistor and a transistor according to an embodiment in terms of the effect which the sloping nature of the PR mask edge 1706 and the potential variation of its horizontal position may have on the threshold voltage of the transistor.

Figure 24:
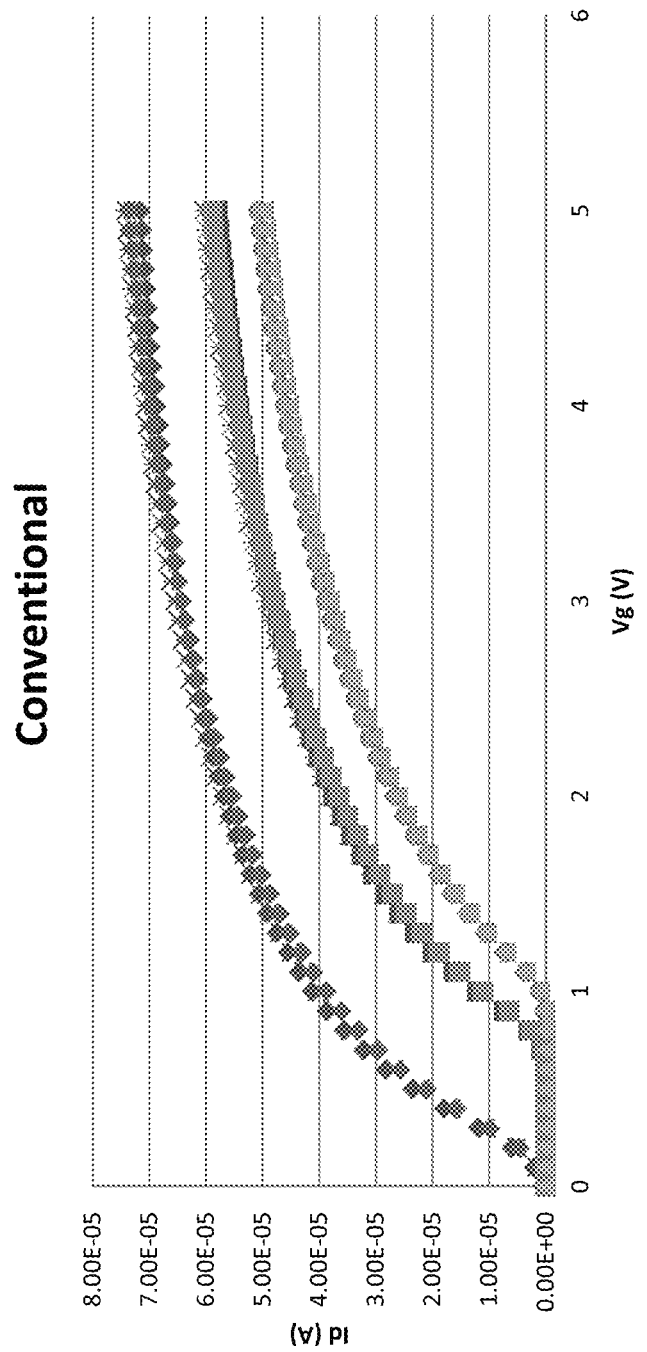
FIG. 24 illustrates a graph plotting the drain current against the gate voltage for several conventional transistors.

FIG. 24 shows a graph plotting the drain current $I_d$ (vertical axis) against the voltage applied to the gate $V_g$ (or gate voltage, horizontal axis) for several conventional transistors, each manufactured with multiple implants, whereby all implants (deep and shallow) were carried out using the thick PR based implant scheme shown in FIGS. 17 and 21.

The threshold voltage $V_T$ is the gate voltage at which the drain current increases appreciably, i.e. where the different plots shown in FIG. 24 leave the horizontal axis.

Most of the parameters resulting in the different curves are immaterial. What is worth noting is that there are three distinct branches (top, middle, bottom), each representing one of three different groups of transistors. The transistors of the top branch had a drawn channel length of 0.1 μm, the transistors of the middle branch had a drawn channel length of 0.2 μm and the transistors of the bottom branch had a drawn channel length of 0.3 μm.

As can be seen, the threshold voltage $V_T$ is largely consistent within each branch but varies greatly from one branch to another, i.e. approx. 0.1 V for the top branch, approx. 0.8 V for the middle branch and approx. 1.0 V for the bottom branch. This is because the implant contributing to the channel surface (for $V_T$ control) will have been blocked to a greater or smaller extent due to the sloping nature of the thick PR mask. Such a large variation in the threshold voltage is undesirable.

It is worth noting that at the short channel lengths contemplated (0.1 μm to 0.3 μm) the dominant factor affecting $V_T$ is the OLE (blocking the $V_T$ specific component of the implant), as illustrated with reference to FIGS. 18 and 21, rather than the drawn length of the channel. In other words, even though the drawn channel lengths are different, the value of $V_T$ of the devices should be approximately the same (in the absence of any OLE). However, with the thick PR mask scheme as per FIGS. 21 and 24, the OLE becomes the dominating factor, resulting in undesirable variation in the threshold voltage $V_T$.

Figure 25:
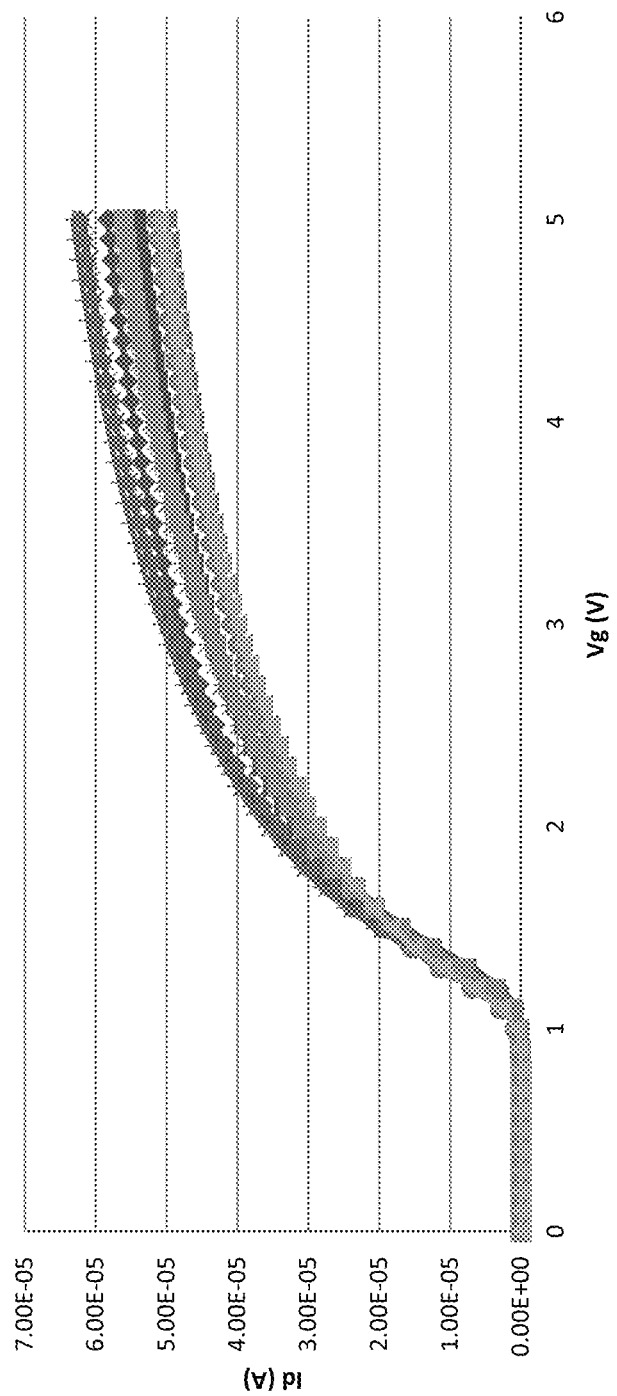
FIG. 25 illustrates a graph plotting the drain current against the gate voltage for several transistors, in accordance with an embodiment of the present invention.

FIG. 25 shows a graph plotting the drain current $I_d$ (vertical axis) against the gate voltage $V_g$ (horizontal axis) for a number of transistors manufactured in accordance with the methods described herein. Each of these transistors has multiple implants. For each transistor, at least one deeper implant has been carried out using the thick PR based implant scheme as per FIG. 20 and at least one shallower implant has been carried out using the thinner PR based implant scheme as per FIG. 22.

The transistors used to generate the plot of FIG. 25 could again be divided into three distinct groups, each group being characterised by one of three different channel lengths close to the required minimum channel length. In order to generate three different channel lengths, devices were used having three drawn channel lengths such as 0.1 μm, 0.2 μm and 0.3 μm. For each of these cases, a further split of mask overlay error (of up to 100 nm) was applied in TCAD to check their OLE robustness. Despite this, the curves associated with each transistor show very little variation in terms of $V_T$. This demonstrates that the misalignment error as described with reference to FIG. 18 does not have a significant effect on the threshold voltage $V_T$ because of the reduced PR mask thickness in the two step implant scheme, unlike in the single step (thick PR mask) implant scheme, whose results are shown in FIG. 24. In other words, the reduced PR mask thickness mitigates the effect which the OLE has on $V_T$.

Although the invention has been described in terms of embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims.

Each feature disclosed or illustrated in the present specification may be incorporated in the invention, whether alone or in any appropriate combination with any other feature disclosed or illustrated herein.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

What is claimed is:

1. A method of fabricating a laterally diffused metal oxide semiconductor field-effect transistor comprising:
   providing a substrate;
   forming a first well of a first doping polarity type in the substrate;
   forming a gate on a portion of the first well, the gate comprising an oxide layer and an at least partially conductive layer on the oxide layer;
   forming a second well of a second doping polarity type at least partially in the first well by implanting ions in the first well, the second well extending under a portion of the gate, the second doping polarity type being of opposite type to the first doping polarity type;
   adding a sloped insulating portion to a side of the gate after the forming of the second well;
   forming a first one of a source and drain of the first doping polarity type in or on the second well by implanting ions in the second well, said ions penetrating underneath the gate, thereby defining a channel of the transistor under the gate; and
   forming a second one of the source and drain of the first doping polarity type in or on the first well,
   wherein, in forming the first one of the source and drain, the sloped insulating portion limits said penetration of ions underneath the gate to offset a lateral interface between the first one of the source or drain and the second well from a lateral interface between the first well and the second well,
   wherein, in forming the second well, said implanting comprises:
      directing at least a first beam of ions towards the first well at an angle substantially perpendicular to a surface plane of the substrate, at least a portion of the first well having a mask formed thereon, said mask having a first thickness during said directing of the first beam; and
      directing at least a second beam of ions towards the first well at an angle substantially offset from a surface normal of the substrate, said mask having a second thickness during said directing of the second beam, wherein the second thickness is less than the first thickness.

2. The method of claim 1 wherein the channel is formed in a portion of the second well and has a first edge and a second edge, wherein the first edge is located at an interface between the second well and the first one of the source and drain, and the second edge is located under the gate at an interface between the second well and the first well.

3. The method of claim 2 wherein the first one of the source and drain is formed directly in or on the second well.

4. The method of claim 2 wherein the second one of the source and drain is formed directly in or on the first well.

5. The method of claim 2 wherein the second well is formed completely in the first well.

6. The method of claim 2 wherein forming the second well comprises using the gate as a mask or as part of a mask during an implant for forming the second well.

7. The method of claim 6 further comprising carrying out a spike anneal.

8. The method of claim 6 wherein by using the gate as the mask or as part of the mask during the implant for forming the second well the second edge of the channel is formed in a self-aligned manner with respect to the gate.

9. The method of claim 2 wherein in forming the first one of the source and drain, the first edge of the channel is defined in a self-aligned manner with respect to the gate.

10. The method of claim 2 wherein directing the second beam of ions towards the first well at an angle substantially offset from a surface normal of the substrate causes the second edge of the second well to be formed under the gate in a self-aligned manner with respect to the gate.

11. The method of claim 1 wherein both edges of the channel are formed in a self-aligned manner.

12. The method of claim 1 wherein, in forming the second one of the source and drain of the first doping polarity type in or on the first well, a drift region of the transistor in the first well is defined, the drift region extending from the channel of the transistor to the second one of the source and drain.

13. The method of claim 1 wherein forming the second well is carried out in an area adjacent to one side of the gate.

14. The method of claim 1 wherein an edge of the gate and an edge of the mask are substantially aligned.

15. The method of claim 1 wherein said implanting comprises directing the first beam of ions towards the first well before directing the second beam of ions towards the first well.

16. The method of claim 1 wherein the first thickness is between three and four times the second thickness.

17. The method of claim 1 further wherein the sloped insulating portion comprises at least one side wall spacer to the gate.

18. The method of claim 17, wherein adding the at least one side wall spacer to the gate comprises adding the at least one side wall spacer to the gate after forming the second well and before forming the first one of the source and drain.

19. A method for use in fabricating a laterally diffused metal oxide semiconductor transistor comprising:
   providing a substrate;
   forming a first well of a first doping polarity type in the substrate;
   forming a gate on a portion of the first well, the gate comprising an oxide layer and an at least partially conductive layer on the oxide layer;
   forming a second well of a second doping polarity type in a portion of the first well by implanting ions in the first well in an area adjacent to and extending under a portion of the gate;
   adding a sloped insulating portion to a side of the gate after forming the second well, wherein a lower portion of the sloped insulating portion is offset from a lower portion of the gate; and
   forming a first one of a source and drain of the first doping polarity type in or on the second well by implanting ions in the second well, said ions penetrating underneath the gate, thereby defining a self-aligned channel of the transistor in the second well, wherein the sloped insulating portion is configured to limit said penetration of ions underneath the gate;

wherein, in forming said second well, said implanting comprises:

directing at least a first beam of ions towards the first well at an angle substantially perpendicular to a surface plane of the substrate, at least a portion of the first well having a mask formed thereon, said mask having a first thickness during said directing of the first beam; and directing at least a second beam of ions towards the first well at an angle substantially offset from a surface normal of the substrate, said mask having a second thickness during said directing of the second beam; wherein the second thickness is less than the first thickness.

20. The method of claim 19 further comprising forming a second one of the source and drain of the first doping polarity type directly in or on the first well, thereby defining a drift region of the transistor in the first well.

21. The method of claim 19 wherein a doping concentration of the second well is between 0.5 and 1.5 orders higher than a doping concentration of the first well.

22. The method of claim 19 wherein a doping concentration of the first one of the source and drain of the first doping polarity type in or on the second well is between 0.5 and 1.5 orders higher than a doping concentration of the second well.

23. A method of fabricating a laterally diffused metal oxide semiconductor transistor comprising:

providing a substrate;

forming a first well of a first doping polarity type in the substrate;

forming a gate on a portion of the first well, the gate comprising an oxide layer and an at least partially conductive layer on the oxide layer;

forming a second well of a second doping polarity type in a portion of the first well by implanting ions in the first well in an area adjacent to and extending under a portion of the gate, thereby defining a self-aligned channel of the transistor under the gate; and adding a sloped insulating portion to a side of the gate after forming the second well, wherein a lower portion of the sloped insulating portion is offset from a lower portion of the gate and wherein the sloped insulating portion is configured to limit penetration of ions underneath the gate in a forming of a first one of a source and drain of the first doping polarity type in or on the second well, wherein, in forming the second well, said implanting comprises:

directing at least a first beam of ions towards the first well at an angle substantially perpendicular to a surface plane of the substrate, at least a portion of the first well having a mask formed thereon, said mask having a first thickness during said directing of the first beam; and directing at least a second beam of ions towards the first well at an angle substantially offset from a surface normal of the substrate, said mask having a second thickness during said directing of the second beam, wherein the second thickness is less than the first thickness.

24. The method of claim 23 wherein a length of the channel is between 0.75 and 1.5 times a critical dimension of a photolithography process.

* * * * *